(12) United States Patent
Kim et al.

(10) Patent No.: US 11,626,401 B2
(45) Date of Patent: Apr. 11, 2023

(54) INTEGRATED CIRCUIT DEVICES AND METHODS OF MANUFACTURING THE SAME

(71) Applicant: Samsung Electronics Co., Ltd., Suwon-si (KR)

(72) Inventors: Jaemun Kim, Seoul (KR); Gyeom Kim, Hwaseong-si (KR); Dahye Kim, Yongin-si (KR); Jinbum Kim, Seoul (KR); Kyungin Choi, Seoul (KR); Ilgyou Shin, Anyang-si (KR); Seunghun Lee, Hwaseong-si (KR)

(73) Assignee: Samsung Electronics Co., Ltd.

( * ) Notice: Subject to any disclaimer, the term of this patent is extended or adjusted under 35 U.S.C. 154(b) by 205 days.

(21) Appl. No.: 16/991,530

(22) Filed: Aug. 12, 2020

(65) Prior Publication Data

US 2021/0118877 A1 Apr. 22, 2021

(30) Foreign Application Priority Data

Oct. 22, 2019 (KR) .......................... 10-2019-0131580

(51) Int. Cl.
*H01L 27/088* (2006.01)
*H01L 21/8234* (2006.01)
*H01L 21/02* (2006.01)

(52) U.S. Cl.
CPC ...... *H01L 27/0886* (2013.01); *H01L 21/0245* (2013.01); *H01L 21/823431* (2013.01); *H01L 21/823475* (2013.01); *H01L 21/823481* (2013.01)

(58) Field of Classification Search
CPC .......... H01L 29/7831; H01L 29/66795; H01L 29/785; H01L 27/0886; H01L 27/0924; H01L 21/823431
See application file for complete search history.

(56) References Cited

U.S. PATENT DOCUMENTS

| | | |
|---|---|---|
| 9,881,831 B2 | 1/2018 | Chiu et al. |
| 10,236,290 B2 | 3/2019 | Bi et al. |
| 10,269,908 B2 | 4/2019 | Chang et al. |
| 10,312,369 B2 | 6/2019 | Chiang et al. |
| 2013/0234204 A1* | 9/2013 | Kang .................. H01L 29/7856 257/190 |

(Continued)

*Primary Examiner* — Tuan A Hoang
(74) *Attorney, Agent, or Firm* — Myers Bigel, P.A.

(57) ABSTRACT

An integrated circuit device includes: a fin-type active area protruding from a substrate, extending in a first direction parallel to an upper surface of the substrate, and including a first semiconductor material; an isolation layer arranged on the substrate and covering a lower portion of a sidewall of the fin-type active area, the isolation layer including an insulation liner conformally arranged on the lower portion of the sidewall of the fin-type active area, and an insulation filling layer on the insulation liner; a capping layer surrounding an upper surface and the sidewall of the fin-type active area, including a second semiconductor material different from the first semiconductor material, and with the capping layer having an upper surface, a sidewall, and a facet surface between the upper surface and the sidewall; and a gate structure arranged on the capping layer and extending in a second direction perpendicular to the first direction.

16 Claims, 27 Drawing Sheets

(56) References Cited

U.S. PATENT DOCUMENTS

| | | | |
|---|---|---|---|
| 2017/0236841 A1* | 8/2017 | Song | H01L 27/0886 |
| | | | 257/192 |
| 2017/0278971 A1* | 9/2017 | Chen | H01L 29/7851 |
| 2018/0145131 A1 | 5/2018 | Wang et al. | |
| 2018/0350969 A1 | 12/2018 | Ching et al. | |
| 2019/0035923 A1* | 1/2019 | Sadana | H01L 29/78696 |
| 2019/0148551 A1* | 5/2019 | More | H01L 21/823864 |
| | | | 257/192 |
| 2019/0148555 A1 | 5/2019 | Huang et al. | |

\* cited by examiner

X2 − X2'

INTEGRATED CIRCUIT DEVICES AND METHODS OF MANUFACTURING THE SAME

CROSS-REFERENCE TO RELATED APPLICATION

This application claims the benefit of Korean Patent Application No. 10-2019-0131580, filed on Oct. 22, 2019, in the Korean Intellectual Property Office, the disclosure of which is incorporated by reference herein in its entirety.

BACKGROUND

The present disclosure relates to integrated circuit devices and methods of manufacturing the same, and more particularly, to integrated circuit devices including fin-type active areas, and to methods of manufacturing the integrated circuit devices.

Recent trends towards light, thin, small, and short electronic products have resulted in an increased desire for integrated circuit devices that are highly integrated. As integrated circuit devices are down-scaled, a short channel effect of a transistor may occur, and thus the reliability of integrated circuit devices may be degraded. Integrated circuit devices including a fin-type active area have been proposed to reduce occurrence of the short channel effect. However, a decrease in the size of the fin-type active area may result in an increased likelihood of damage to the fin-type active area, such as surface oxidation, and thus, the reliability of integrated circuit devices may be degraded.

SUMMARY

Some aspects of the present disclosure provide integrated circuit devices that have a reduced size and high reliability.

Some aspects of the present disclosure provide methods of manufacturing integrated circuit devices that have a reduced size and high reliability.

According to some aspects of the inventive concept, an integrated circuit device includes a fin-type active area protruding from a substrate, extending in a first direction parallel to an upper surface of the substrate, and including a first semiconductor material; an isolation layer arranged on the substrate and covering a lower portion of a sidewall of the fin-type active area, the isolation layer including an insulation liner arranged on the lower portion of the sidewall of the fin-type active area, and an insulation filling layer on the insulation liner; a capping layer surrounding an upper surface and the sidewall of the fin-type active area, including a second semiconductor material that is different from the first semiconductor material, with the capping layer having an upper surface, a sidewall, and a facet surface between the upper surface and the sidewall; and a gate structure arranged on the capping layer and extending in a second direction that is parallel to the upper surface of the substrate and perpendicular to the first direction.

According to some aspects of the inventive concepts, an integrated circuit device includes a fin-type active area protruding from a substrate, extending in a first direction parallel to an upper surface of the substrate, and including a first semiconductor material; an isolation layer arranged on the substrate and covering a lower portion of a sidewall of the fin-type active area, the isolation layer including an insulation liner arranged on the lower portion of the sidewall of the fin-type active area, and an insulation filling layer on the insulation liner; a capping layer surrounding an upper surface and the sidewall of the fin-type active area, with the capping layer including a second semiconductor material that is different from the first semiconductor material, and the capping layer including an upper surface, a sidewall, and a facet surface between the upper surface and the sidewall; and a gate structure arranged on the capping layer and extending in a second direction that is parallel to the upper surface of the substrate and perpendicular to the first direction, wherein, on the sidewall of the fin-type active area, a bottom surface of the capping layer contacts an upper surface of the insulation liner.

According to some aspects of the inventive concepts, an integrated circuit device includes a first fin-type active area arranged on a substrate, extending in a first direction parallel to an upper surface of the substrate, and including a first semiconductor material; a second fin-type active area arranged on the substrate, spaced apart from the first fin-type active area in a second direction perpendicular to the first direction, with the second fin-type active area extending in the first direction, including the first semiconductor material, and having a first sidewall facing the first fin-type active area and a second sidewall opposite to the first sidewall; a first capping layer surrounding an upper surface and a sidewall of the first fin-type active area, the first capping layer including a second semiconductor material that is different from the first semiconductor material, and the first capping layer having an upper surface, a sidewall, and a facet surface between the upper surface and the sidewall; a second capping layer surrounding an upper surface and a sidewall of the second fin-type active area and including the second semiconductor material, the second capping layer including a first portion arranged on the first sidewall of the second fin-type active area, and a second portion arranged on the second sidewall of the second fin-type active area and having a bottom surface arranged at a higher level than a bottom surface of the first portion; and a gate structure intersecting the first fin-type active area and the second fin-type active area and extending in the second direction.

According to another aspect of the inventive concept, a method of manufacturing an integrated circuit device includes forming a fin-type active area including a first semiconductor material on a substrate, the fin-type active area extending in a first direction parallel to an upper surface of the substrate; forming an isolation layer that covers a lower portion of a sidewall of the fin-type active area, the isolation layer including an insulation liner and an insulation filling layer; forming a capping layer on an exposed surface of the fin-type active area, the capping layer including a second semiconductor material that is different from the first semiconductor material; shaping the capping layer such that the capping layer has an upper surface, a sidewall, and a facet surface between the upper surface and the sidewall, with the capping layer shaped by performing an etchback process on the capping layer; and forming a gate structure on the capping layer, the gate structure extending in a second direction that is perpendicular to the first direction and is perpendicular to the upper surface of the substrate.

BRIEF DESCRIPTION OF THE DRAWINGS

Examples of embodiments of the inventive concept may be more clearly understood from the following detailed description taken in conjunction with the accompanying drawings in which:

FIGS. 12A through 20B are cross-sectional views illustrating a method of manufacturing an integrated circuit device, according some an embodiments, wherein FIGS. 12A, 13A, 16A, 17A, 18A, 19A, and 20A are cross-sectional views corresponding to line X2-X2' of FIG. 9, and FIGS. 12B, 13B, 14, 15, 16B, 17B, 18B, 19B, and 20B are cross-sectional views corresponding to line Y2-Y2' of FIG. 9.

DETAILED DESCRIPTION

Aspects of the present disclosure will now be described more fully with reference to the accompanying drawings.

Figure 1:
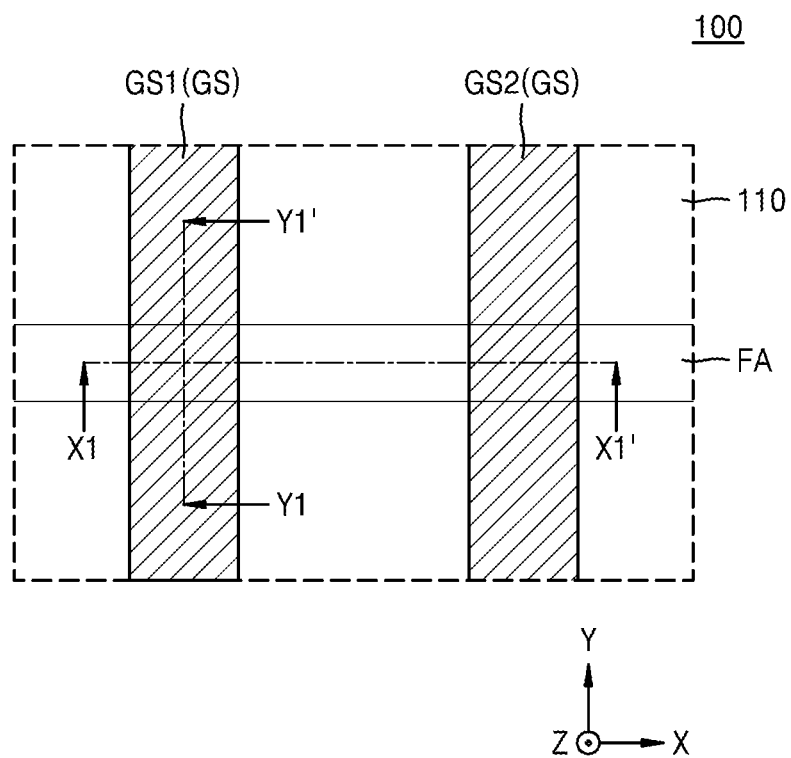
FIG. 1 is a layout view of an integrated circuit device according to some embodiments.
Figure 2:
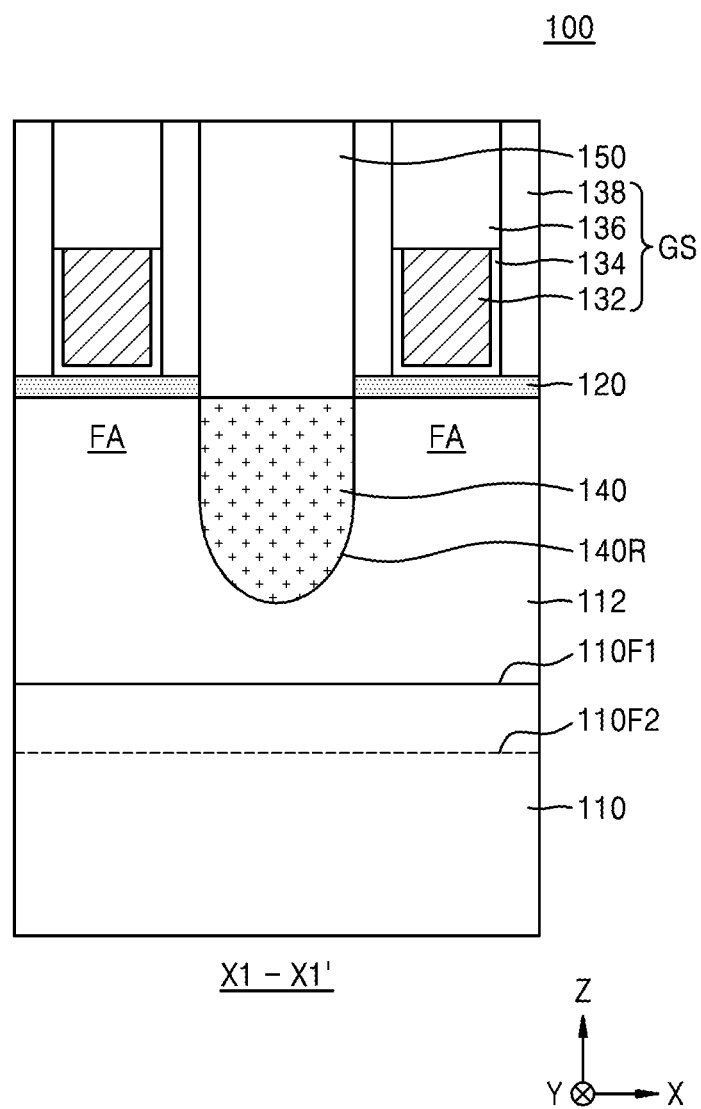
FIG. 2 is a sectional view of the integrated circuit device taken along line X1-X1' in FIG. 1.
Figure 3:
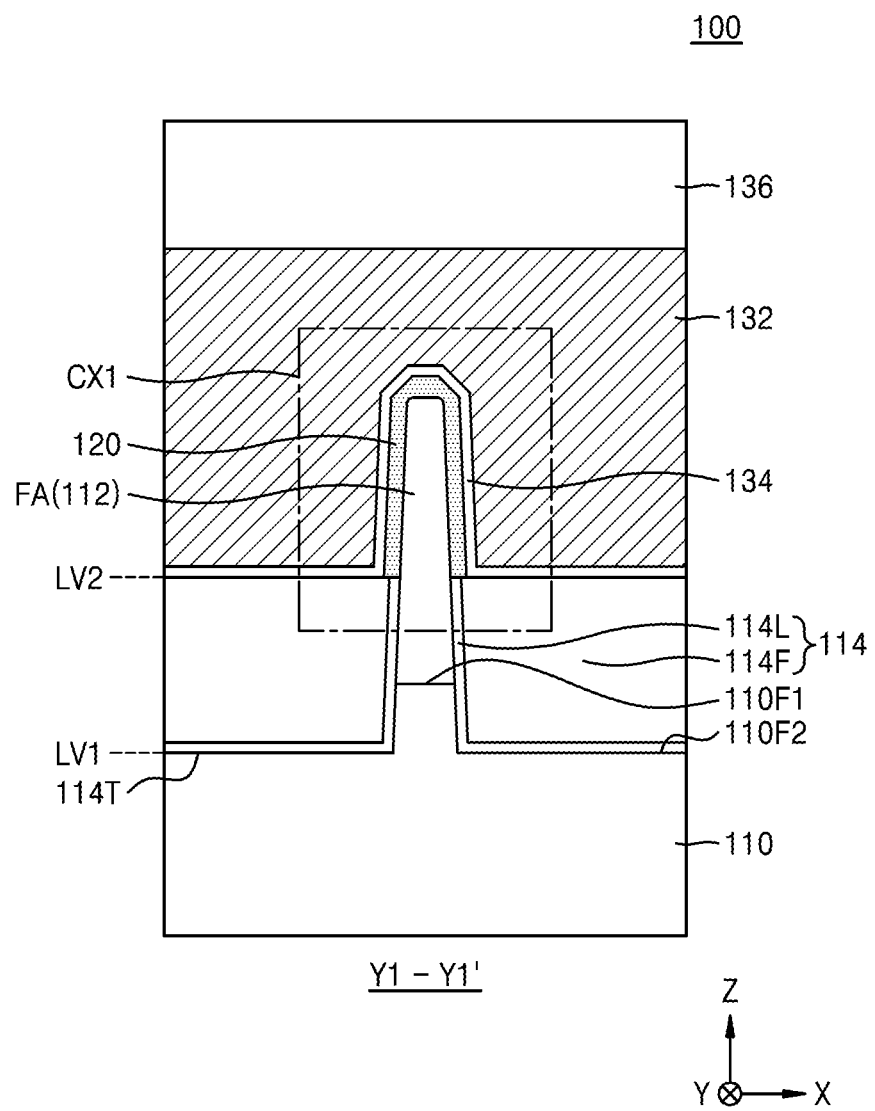
FIG. 3 is a sectional view of the integrated circuit device taken along line Y1-Y1' in FIG. 1.
Figure 4:
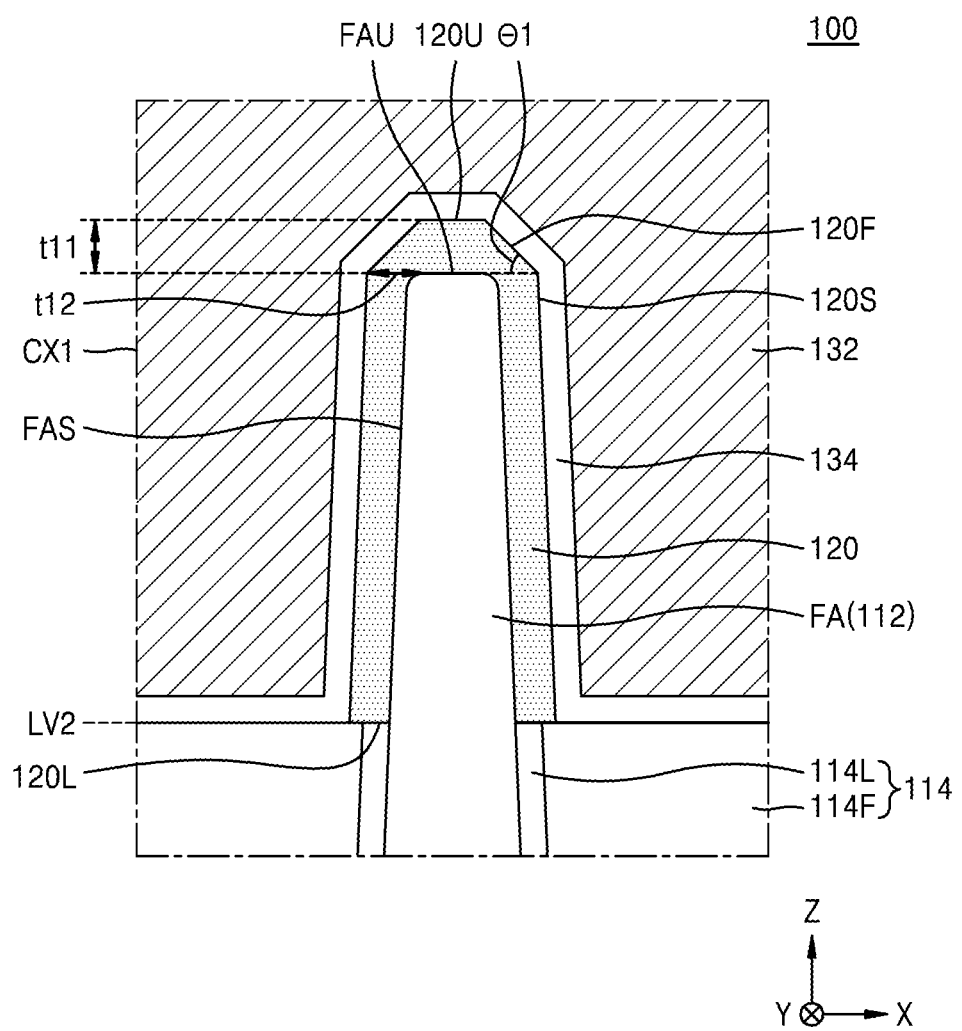
FIG. 4 is an enlarged view of a portion CX1 of FIG. 3.

FIG. 1 is a layout view of an integrated circuit device 100 according to some embodiments. FIG. 2 is a sectional view of the integrated circuit device 100 taken along line X1-X1' in FIG. 1. FIG. 3 is a sectional view of the integrated circuit device 100 taken along line Y1-Y1' in FIG. 1. FIG. 4 is an enlarged view of a region CX1 of FIG. 3. For convenience of description and for ease of illustration, FIG. 1 illustrates a layout of only some components of the integrated circuit device 100, for example, a fin-type active area FA and gate structures GS.

Referring to FIGS. 1 through 4, a first semiconductor layer 112 may be arranged on a first upper surface 110F1 of a substrate 110, and a fin-type active area FA including the first semiconductor layer 112 may protrude from a second upper surface 110F2 of the substrate 110. The fin-type active area FA may extend in a first direction (i.e., an X direction of FIG. 1) parallel to the second upper surface 110F2 of the substrate 110. An isolation layer 114 covering lower portions of both sidewalls of the fin-type active area FA may be arranged on the substrate 110.

According to some embodiments, the substrate 110 may include a Group IV semiconductor (such as silicon (Si) or germanium (Ge)), a Groups IV-IV elements-containing compound semiconductor (such as silicon-germanium (SiGe) or silicon-carbide (SiC)), or a Groups III-V elements-containing compound semiconductor (such as gallium arsenide (GaAs), indium arsenide (InAs), or indium phosphide (InP)). The substrate 110 may include a conductive region, for example, an impurity-doped well or an impurity-doped structure. The fin-type active area FA may be an active area that constitutes an NMOS transistor or an active area that constitutes a PMOS transistor.

According to some embodiments, the first semiconductor layer 112 may include a first semiconductor material. For example, the first semiconductor material may be different from a material used to form the substrate 110. According to some embodiments, the substrate 110 may include silicon (Si), and the first semiconductor layer 112 may include silicon germanium (Ge). According to some embodiments, the substrate 110 may include silicon germanium having a first content (e.g., concentration) of germanium, and the first semiconductor layer 112 may include silicon germanium having a second content (e.g., concentration) of germanium, where the second content is different from the first content.

As best seen in FIGS. 3 and 4, the isolation layer 114 may include an insulation liner 114L and an insulation filling layer 114F. The insulation liner 114L may be formed to cover the second upper surface 110F2 of the substrate 110 and a lower portion of a sidewall FAS of the fin-type active area FA. The insulation filling layer 114F may be on the insulation liner 114L and may surround the lower portion of the sidewall FAS of the fin-type active area FA. For example, the insulation liner 114L may include, but is not limited to, an oxide layer formed according to a process of oxidizing the surface of the fin-type active area FA, and the insulation filling layer 114F may include, but is not limited to, fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ).

As best seen in FIG. 4, a capping layer 120 may be arranged on an upper portion of the sidewall FAS of the fin-type active area FA and an upper surface FAU of the fin-type active area FA. The capping layer 120 may include a second semiconductor material. The second semiconductor material may be different from the first semiconductor material included in the fin-type active area FA (for example, included in the first semiconductor layer 112). According to some embodiments, the second semiconductor material may include silicon, and the first semiconductor material may include silicon germanium. According to some embodiments, the second semiconductor material may include silicon germanium having a first content of germanium, and the first semiconductor material may include silicon germanium having a second content of germanium that is different from the first content. However, the inventive concepts are not limited thereto.

The capping layer 120 may have an upper surface 120U, a sidewall 120S, and a facet surface 120F. The facet surface 120F may be inclined at a first angle θ1 with respect to the first upper surface 110F1 of the substrate 110. In some embodiments, the first angle θ1 may be between about 30° to about 60°. For example, the facet surface 120F may be preferentially oriented as a crystal plane that is parallel to a (111) plane of a silicon crystal structure, and the first angle θ1 of the facet surface 120F may be between about 41° to about 46°. However, the inventive concepts are not limited thereto.

The capping layer 120 may have a first thickness t11 on the upper surface FAU of the fin-type active area FA and may have a second thickness t12 on the sidewall FAS of the fin-type active area FA or at the edge of the facet surface 120F. The second thickness t12 may be less than the first thickness t11. The first thickness t11 may be, but is not limited to, between about 5 Å to about 30 Å.

According to some embodiments, the capping layer 120 may be formed on the fin-type active area FA via an epitaxy process that uses the second semiconductor material, and an etchback process performed subsequent to the epitaxy process. As a result of the epitaxy process and the subsequent etchback process, the capping layer 120 may be formed to have a shape including the facet surface 120F. The capping layer 120 may function as a protection layer that prevents loss of germanium from the surface of the fin-type active area FA and/or prevents damage to the surface of the fin-type active area FA during one or more subsequent manufacturing processes.

As shown in FIG. 4, the capping layer 120 may be formed on the upper portion of the sidewall FAS of the fin-type active area FA and the upper surface FAU thereof, and may not be formed on the lower portion of the sidewall FAS of the fin-type active area FA that is covered by the insulation liner 114L. In other words, the lower portion of the sidewall FAS of the fin-type active area FA that is covered by the insulation liner 114L may be free of the capping layer 120. A bottom surface 120L of the capping layer 120 may contact the upper surface of the insulation liner 114L and may be arranged at the same level as an upper surface level LV2 of the isolation layer 114.

A gate structure GS extending in a second direction (i.e., a Y direction of FIG. 1) parallel to the first upper surface 110F1 of the substrate 110 may be arranged on the capping layer 120 and the isolation layer 114. For example, as shown in FIG. 1, a first gate structure GS1 and a second gate structure GS2 may be spaced apart from each other and may each extend in the second direction, and may intersect with the fin-type active area FA extending in the first direction.

The gate structure GS may include a gate electrode 132, a gate insulation layer 134, a gate capping layer 136, and a gate spacer 138.

The gate electrode 132 may include doped polysilicon, a metal, a conductive metal nitride, a conductive metal carbide, a conductive metal silicide, or a combination thereof. For example, the gate electrode 132 may include, but is not limited to, aluminum (Al), copper (Cu), titanium (Ti), tantalum (Ta), tungsten (W), molybdenum (Mo), tantalum nitride (TaN), nickel silicide (NiSi), cobalt silicide (CoSi), titanium nitride (TiN), tungsten nitride (WN), titanium aluminum (TiAl), titanium aluminum nitride (TiAlN), tantalum carbonitride (TaCN), tantalum carbide (TaC), tantalum silicon nitride (TaSiN), or a combination thereof. According to some embodiments, the gate electrode 132 may include a work function metal containing layer and a gap-fill metal layer. The work function metal containing layer may include at least one metal selected from Ti, W, ruthenium (Ru), niobium (Nb), Mo, hafnium (Hf), nickel (Ni), cobalt (Co), platinum (Pt), ytterbium (Yb), terbium (Tb), dysprosium (Dy), erbium (Er), and palladium (Pd). The gap-fill metal layer may include a W layer or an Al layer. According to some embodiments, the gate electrode 132 may include, but is not limited to, a stack structure of TiAlC/TiN/W, a stack structure of TiN/TaN/TiAlC/TiN/W, or a stack structure of TiN/TaN/TiN/TiAlC/TiN/W.

The gate insulation layer 134 may be arranged to extend in the second direction on the bottom surface and the sidewall of the gate electrode 132. The gate insulation layer 134 may be between the gate electrode 132 and the capping layer 120, and between the gate electrode 132 and the upper surface of the isolation layer 114. Because the capping layer 120 covers the upper surface FAU of the fin-type active area FA and the upper portion of the sidewall FAS of the fin-type active area FA, the gate insulation layer 134 may not contact the fin-type active area FA.

According to some embodiments, the gate insulation layer 134 may include a silicon oxide layer, a silicon oxynitride layer, a high-k dielectric layer having a higher dielectric constant than a silicon oxide layer, or a combination thereof. The high-k dielectric layer may include a metal oxide or a metal oxynitride. For example, the high-k dielectric layer that is usable as the gate insulation layer 134 may be formed of hafnium dioxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), zirconium dioxide ($ZrO_2$), aluminum oxide ($Al_2O_3$), or a combination thereof, but the inventive concepts are not limited thereto.

The gate capping layer 136 may be arranged on the gate electrode 132. The gate capping layer 136 may cover the upper surface of the gate electrode 132 and may extend in the second direction (i.e., the Y direction of FIG. 1). According to some embodiments, the gate capping layer 136 may include silicon nitride or silicon oxynitride.

Gate spacers 138 may be arranged on both sidewalls of the gate electrode 132 and both sidewalls of the gate capping layer 136. The gate spacers 138 may each extend in an extension direction of the gate electrode 132 on both sidewalls of the gate electrode 132, and the gate insulation layer 134 may be between the gate electrode 132 and the gate spacers 138. According to some embodiments, the gate spacers 138 may include silicon oxide ($SiO_x$), silicon nitride ($SiN_x$), silicon oxynitride ($SiO_xN_y$), silicon carbonitride ($SiC_xN_y$), silicon oxycarbonitride ($SiO_xC_yN_z$) or a combination thereof.

According to some embodiments, the gate spacers 138 may include a plurality of layers formed of different materials. Although each of the gate spacers 138 includes a single layer in FIG. 2, each of the gate spacers 138 may include a first spacer layer (not shown), a second spacer layer (not shown), and a third spacer layer (not shown) sequentially stacked on each of the sidewalls of the gate electrode 132. According to some embodiments, the first spacer layer and the third spacer layer may include silicon nitride, silicon oxide, or silicon oxynitride. The second spacer layer may include an insulating material having a dielectric constant lower than that of the first spacer layer. According to some embodiments, the second spacer layer may be or may include an air space.

A source/drain region 140 may be arranged in the fin-type active area FA on respective sides of two adjacent gate structures GS that face each other. The source/drain region 140 may fill the inside of a recess region 140R extending from the respective sides of the two adjacent gate structures GS to the inside of the fin-type active area FA. The bottom surface of the recess region 140R may be at a higher level than a level LV1 of the second upper surface 110F2 of the substrate 110 and may be at lower level than the upper surface level LV2 of the isolation layer 114 (e.g., a bottom surface level of a portion of each gate structure GS that contacts the isolation layer 114). Although not shown in the drawings, the source/drain region 140 may have a polygonal shape having inclined sidewalls in the second direction (Y direction).

According to some embodiments, the source/drain region 140 may include a plurality of semiconductor layers that fill the inside of the recess region 140R. For example, the plurality of semiconductor layers may include, but are not limited to, a doped Si layer, a doped Ge layer, a doped SiC layer, a doped SiGe layer, or a doped InGaAs layer. The plurality of semiconductor layers may have different impurity concentrations from each other. According to some embodiments, when the fin-type active area FA is an active area for an NMOS transistor, the source/drain region 140 may include SiC doped with first impurities or Si doped with the first impurities, and the first impurities may be phosphorus (P), arsenic (As), antimony (Sb), or the like. According to some embodiments, when the fin-type active area FA is an active area for a PMOS transistor, the source/drain region 140 may include SiGe doped with first impurities, and the first impurities may be boron (B), gallium (Ga), or the like.

An inter-gate insulation layer 150 may be arranged between two adjacent gate structures GS and may cover the source/drain region 140 and the isolation layer 114. The inter-gate insulation layer 150 may include silicon oxide, silicon nitride, a TEOS layer, or an ultra-low k (ULK) layer having an ultra-low dielectric constant between about 2.2 to about 2.4. The ULK layer may include a SiOC layer or a SiCOH layer.

The width of the gate structure GS and the length of a channel region may be decreased due to a trend toward downscaling integrated circuit devices, discussed above. A method of forming the fin-type active area FA by using the second semiconductor material (for example, silicon germanium) has been proposed to improve the performance of integrated circuit devices. However, silicon germanium is prone to being oxidized or damaged in a process of removing a sacrificial gate structure for forming a gate electrode and/or in a process of forming a gate insulation layer. In particular, surface oxidation of the fin-type active area FA having a reduced size may cause an increase in the interface defect density of the gate insulation layer or a time dependent dielectric breakdown (TDDB), and thus, the reliability of integrated circuit devices is degraded.

According to some above-described embodiments, the capping layer 120 including the second semiconductor material may be formed on the surface of the fin-type active area FA by using an epitaxy process and a subsequent etchback process. Because the capping layer 120 may prevent the surface of the fin-type active area FA from being oxidized or damaged in a subsequent process of removing a dummy gate electrode and/or in a process of forming a gate insulation layer, an increase in the interface defect density of the gate insulation layer 134 or occurrence of the TDDB may be prevented, and the integrated circuit device 100 may have a high reliability.

Figure 5:
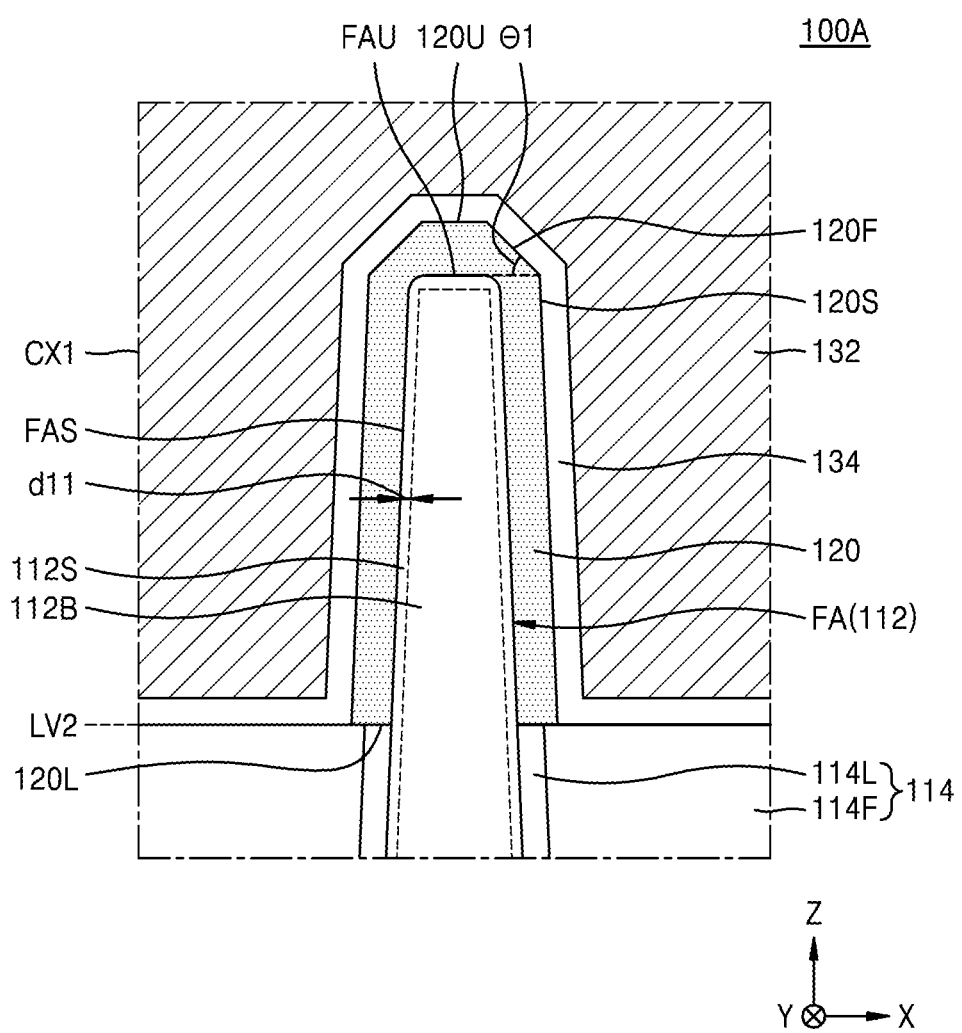
FIG. 5 is a cross-sectional view of an integrated circuit device according to some embodiments.

FIG. 5 is a sectional view of an integrated circuit device 100A according to some embodiments. FIG. 5 is an enlarged sectional view of a portion of the integrated circuit device 100A that corresponds to the region CX1 of FIG. 3. The same reference numerals in FIGS. 1 through 4 and FIG. 5 denote the same elements.

Referring to FIG. 5, a fin-type active area FA may include an inside area 112B and a surface area 112S. The surface area 112S may indicate a portion of the fin-type active area FA located within a first distance d11 from the surface (e.g., a sidewall FAS and an upper surface FAU) of the fin-type active area FA, and the inside area 112B may indicate a portion of the fin-type active area FA beyond the first distance d11 from the surface (e.g., the sidewall FAS and the upper surface FAU) of the fin-type active area FA. In other words, the surface area 112S may be a portion of the fin-type active area FA having a distance from the sidewall FAS of the fin-type active area FA that is less than the first distance d11, and the inside area 112B may be a portion of the fin-type active area FA having a distance from the sidewall FAS of the fin-type active area FA that is greater than the first distance d11.

According to some embodiments, the surface area 112S may include silicon germanium having a first germanium content, and the inside area 112B may include silicon germanium having a second germanium content that is less than the first germanium content. For example, the surface area 112S may be formed by germanium atoms within the fin-type active area FA being diffused or moved to the vicinity of the surface of the fin-type active area FA, in the epitaxy process and the subsequent etchback process for forming the capping layer 120. For example, in the epitaxy process and the subsequent etchback process for forming the capping layer 120, the silicon germanium within the fin-type active area FA may be condensed, and thus, the amount of germanium included in the surface area 112S (e.g., the first germanium content) may be greater than the amount of germanium included in the inside area 112B (e.g., the second germanium content).

According to some embodiments, the surface area 112S may have a first bandgap energy Eg1, the inside area 112B may have a second bandgap energy Eg2, the capping layer 120 may have a third bandgap energy Eg3, and a relationship of Eg1<Eg2<Eg3 may be established. That is, the capping layer 120 may have a greater bandgap energy than the inside area 112B, which in turn has a greater bandgap energy than the surface area 112S. As the surface area 112S, which is between the capping layer 120 and the inside area 112B, has the smallest bandgap energy, namely, the first bandgap energy Eg1, carrier mobility in the channel region of the fin-type active area FA may improve.

According to some above-described embodiments, as the surface area 112S of the fin-type active area FA, which is adjacent to the capping layer 120, has the smallest bandgap energy, namely, the first bandgap energy Eg1, the electrical performance of the integrated circuit device 100A may improve. Moreover, because the capping layer 120 may prevent the surface of the fin-type active area FA from being oxidized or damaged, an increase in the interface defect density of the gate insulation layer 134 or occurrence of the TDDB may be prevented, and the integrated circuit device 100A may have a high reliability.

Figure 6:
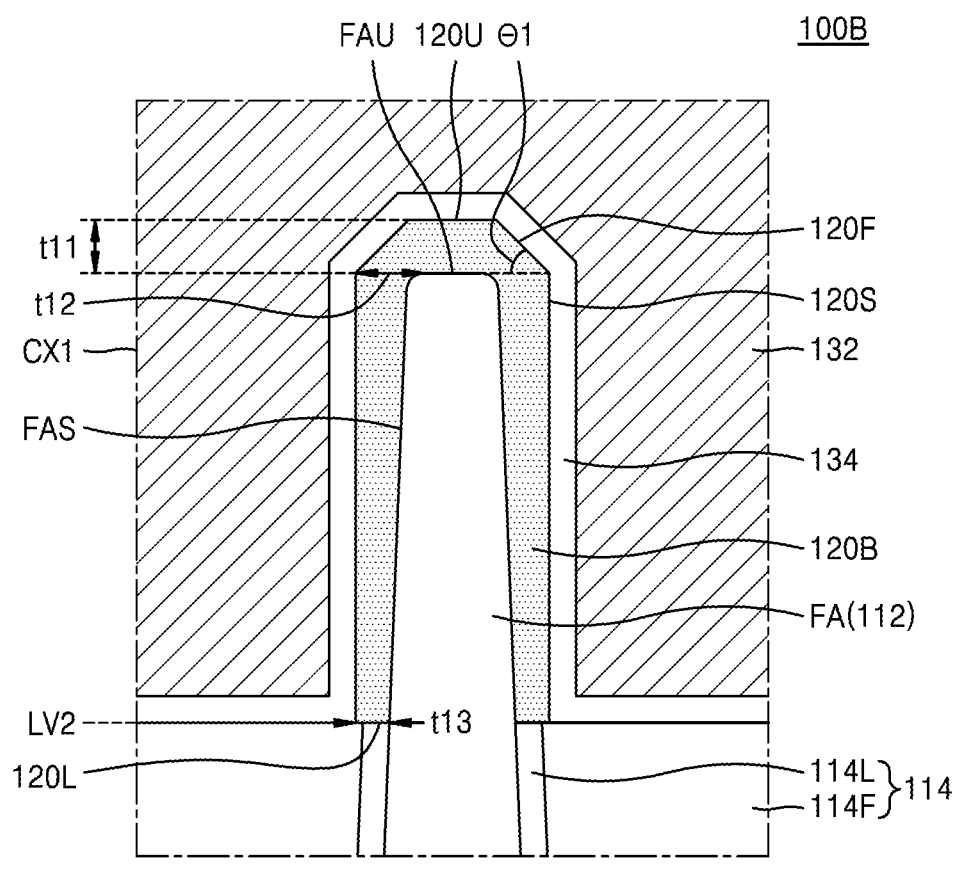
FIG. 6 is a cross-sectional view of an integrated circuit device according to some embodiments.

FIG. 6 is a sectional view of an integrated circuit device 100B according to some embodiments. FIG. 6 is an enlarged sectional view of a portion of the integrated circuit device 100B that corresponds to the region CX1 of FIG. 3. The same reference numerals in FIGS. 1 through 5 and FIG. 6 denote the same elements.

Referring to FIG. 6, a capping layer 120B may have an upper surface 120U, a sidewall 120S, and a facet surface 120F. The capping layer 120B may have a thickness that decreases with increasing distance from the top of the sidewall FAS of the fin-type active area FA. For example, the capping layer 120B may have a first thickness t11 on the upper surface FAU of the fin-type active area FA and may have a second thickness t12 on the sidewall FAS of the fin-type active area FA or at the edge of the facet surface 120F, and the second thickness t12 is less than the first thickness t11. The capping layer 120B may also have a third thickness t13 at a lower portion of the sidewall FAS of the fin-type active area FA, and the third thickness t13 is less than the first thickness t11 or the second thickness t12. For example, the first thickness t11 may be between about 5 Å to about 30 Å, the second thickness t12 may be between about 5 Å to about 30 Å, and the third thickness t13 may be between about 5 Å to about 20 Å, but the inventive concepts are not limited thereto.

According to some embodiments, the capping layer 120B may be formed on the fin-type active area FA via an epitaxy process by using the second semiconductor material and a subsequent etchback process. For example, the capping layer 120B may be formed by performing a first etchback process by using a first etchant gas including germane ($GeH_4$) and then performing a second etchback process by using a second etchant gas including hydrogen chloride (HCl). Alternatively, the capping layer 120B may be formed by performing an etchback process by using an etchant gas including at least one of germane (GeH$_4$), chlorine (Cl$_2$), and hydrogen chloride (HCl). However, the inventive concepts are not limited thereto, and the capping layer 120B may be formed via any of various combinations of an epitaxy process and an etchback process.

The capping layer 120B may function as a protection layer that prevents loss of germanium from the surface of the fin-type active area FA or damage to the surface of the fin-type active area FA in a subsequent manufacturing process.

Figure 7:
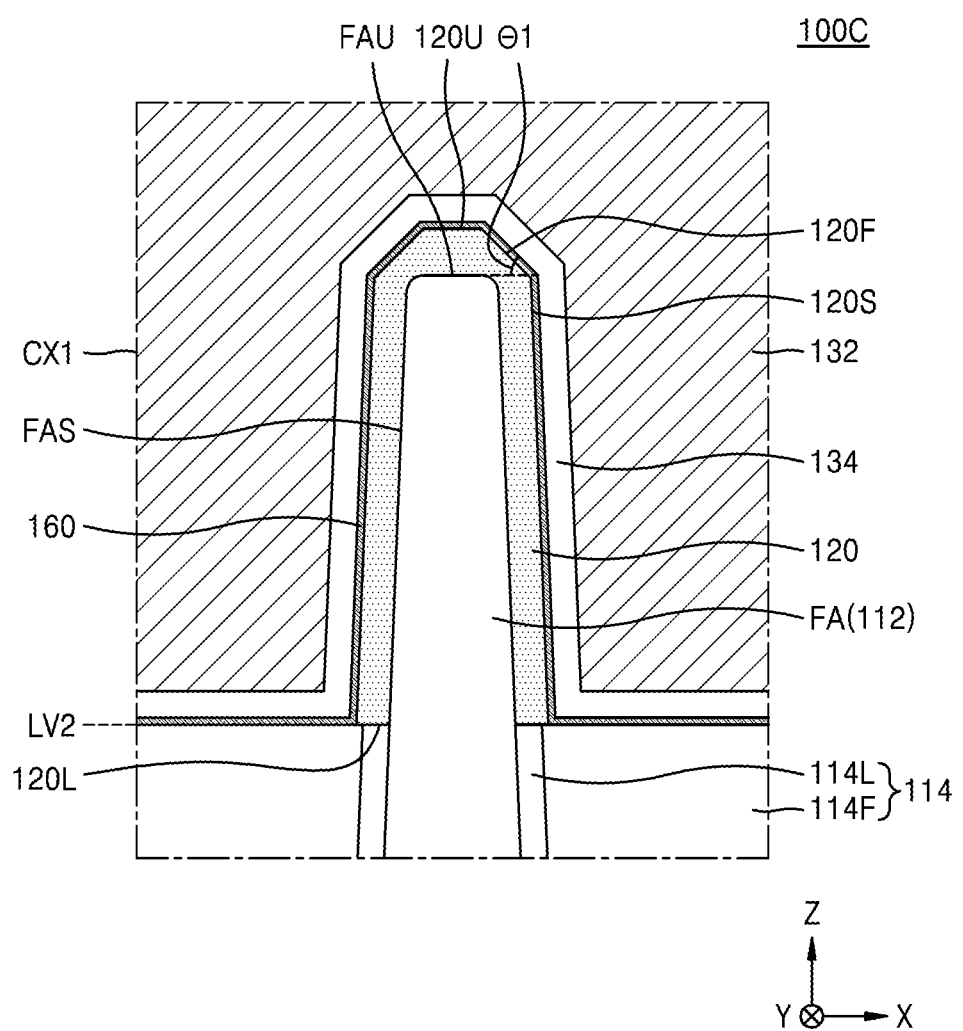
FIG. 7 is a cross-sectional view of an integrated circuit device according to some embodiments.

FIG. 7 is a sectional view of an integrated circuit device 100C according to some embodiments. FIG. 7 is an enlarged sectional view of a portion of the integrated circuit device 100C that corresponds to the region CX1 of FIG. 3. The same reference numerals in FIGS. 1 through 6 and FIG. 7 denote the same elements.

Referring to FIG. 7, an interface layer 160 may be further formed between the capping layer 120 and the gate structure GS and between the isolation layer 114 and the gate structure GS. The interface layer 160 may be arranged between the capping layer 120 and the gate insulation layer 134, and thus, the capping layer 120 and the interface layer 160 may be formed between the fin-type active area FA and the gate insulation layer 134.

According to some embodiments, the interface layer 160 may include at least one of silicon nitride, silicon oxynitride, and silicon carbonitride. For example, the interface layer 160 may include a material layer formed by first forming the capping layer 120 and then performing a plasma nitrification process on respective exposed surfaces of the capping layer 120 and the isolation layer 114. For example, the interface layer 160 may be formed by a portion of the capping layer 120 having a relatively small thickness from the exposed surface of the capping layer 120 being transformed into silicon nitride, and/or a portion of the isolation layer 114 having a relatively small thickness from the exposed surface of the isolation layer 114 being transformed into silicon nitride. However, the inventive concepts are not limited thereto.

According to some embodiments, the interface layer 160 may be formed to have a relatively small thickness, and thus, the thickness of the capping layer 120 may be decreased. For example, because the interface layer 160 together with the capping layer 120 may prevent the surface of the fin-type active area FA from being oxidized or damaged, the integrated circuit device 100C may have a high reliability.

Figure 8:
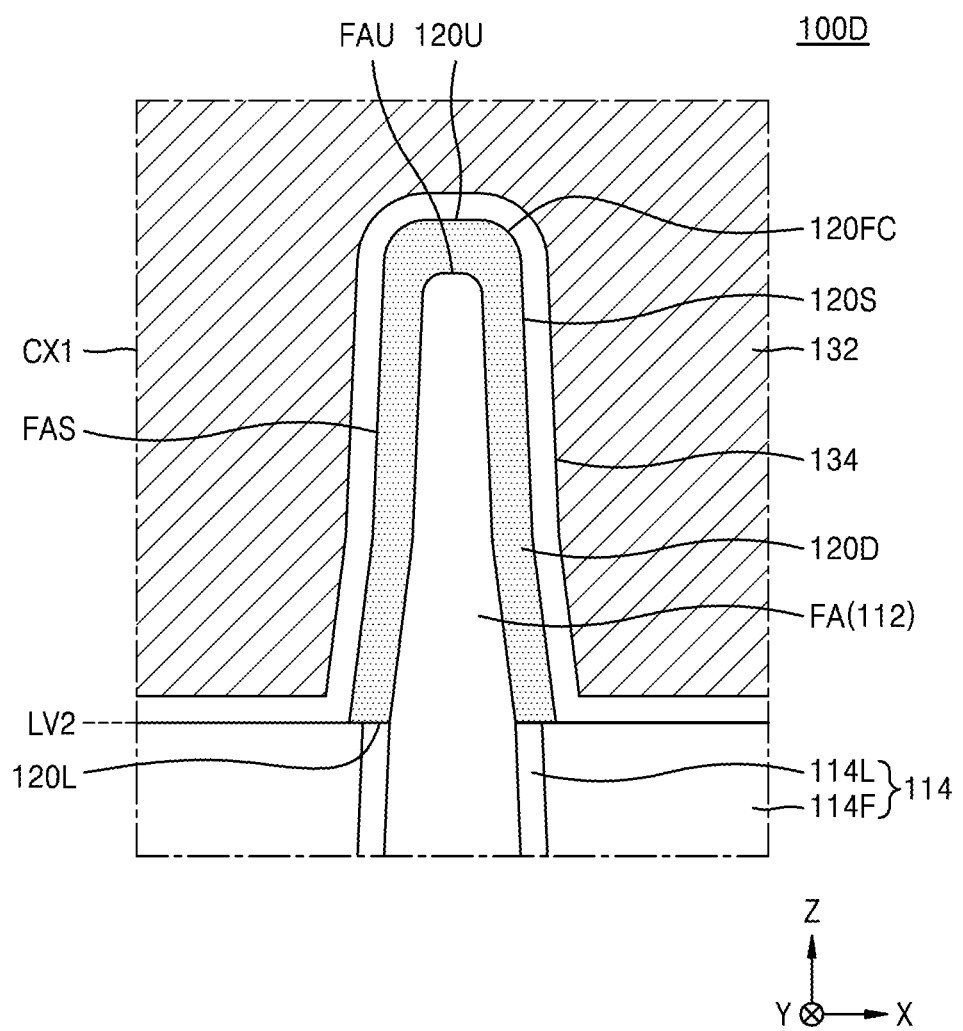
FIG. 8 is a cross-sectional view of an integrated circuit device according to some embodiments.

FIG. 8 is a sectional view of an integrated circuit device 100D according to some embodiments. FIG. 8 is an enlarged sectional view of a portion of the integrated circuit device 100D that corresponds to the region CX1 of FIG. 3. The same reference numerals in FIGS. 1 through 7 and FIG. 8 denote the same elements.

Referring to FIG. 8, a fin-type active area FA may have an upper surface FAU that is round, and a sidewall FAS connected thereto. Each of the upper surface FAU and the sidewall FAS of the fin-type active area FA may form a curved surface. A capping layer 120D may have an upper surface 120U that is round, a sidewall 120S, and a curved surface 120FC between the upper surface 120U and the sidewall 120S.

According to some embodiments, the capping layer 120D may be formed on the fin-type active area FA via an epitaxy process by using the second semiconductor material and a subsequent etchback process. By further performing a hydrogen plasma annealing process after an etchback process, silicon atoms may locally migrate around the surface of the fin-type active area FA, and thus, the facet surface of the capping layer 120D may be changed to the curved surface 120FC.

Figure 9:
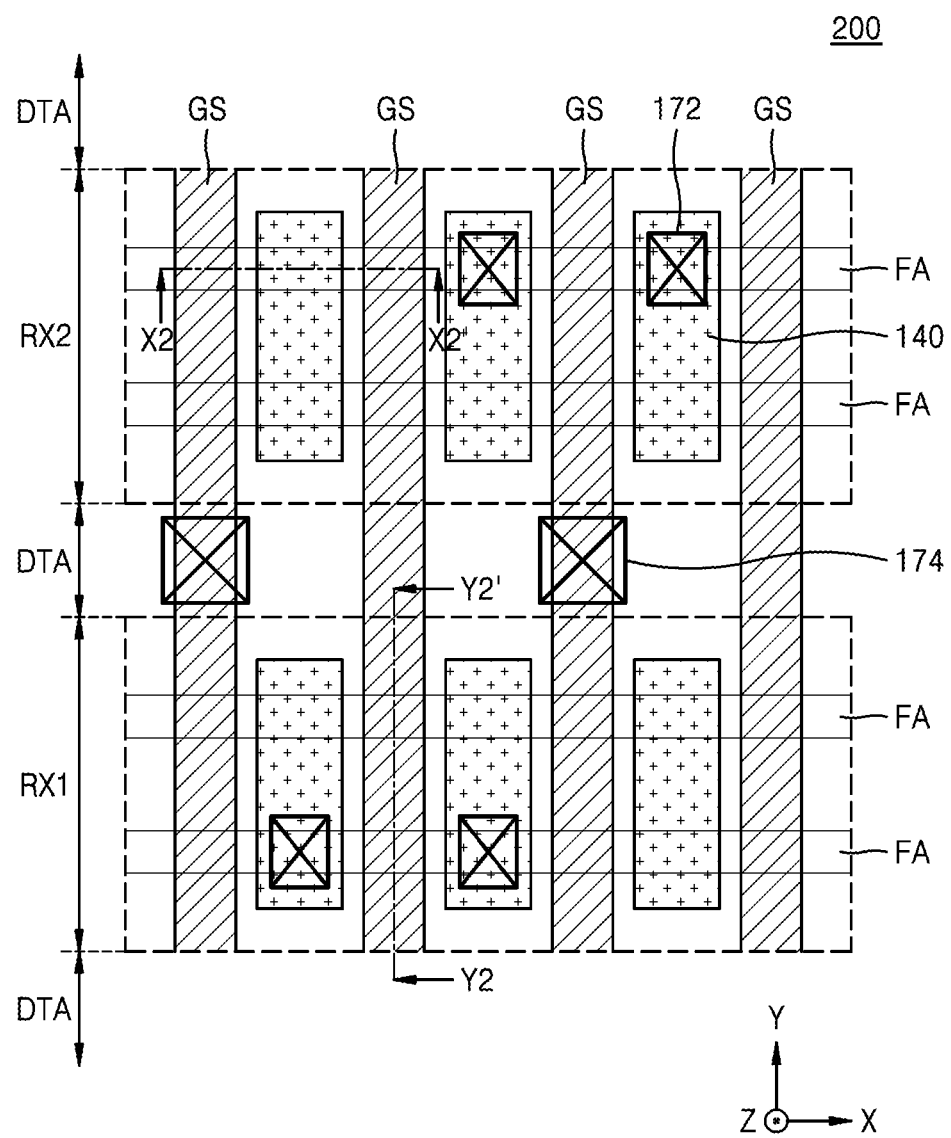
FIG. 9 is a layout view of an integrated circuit device according to some embodiments.
Figure 10:
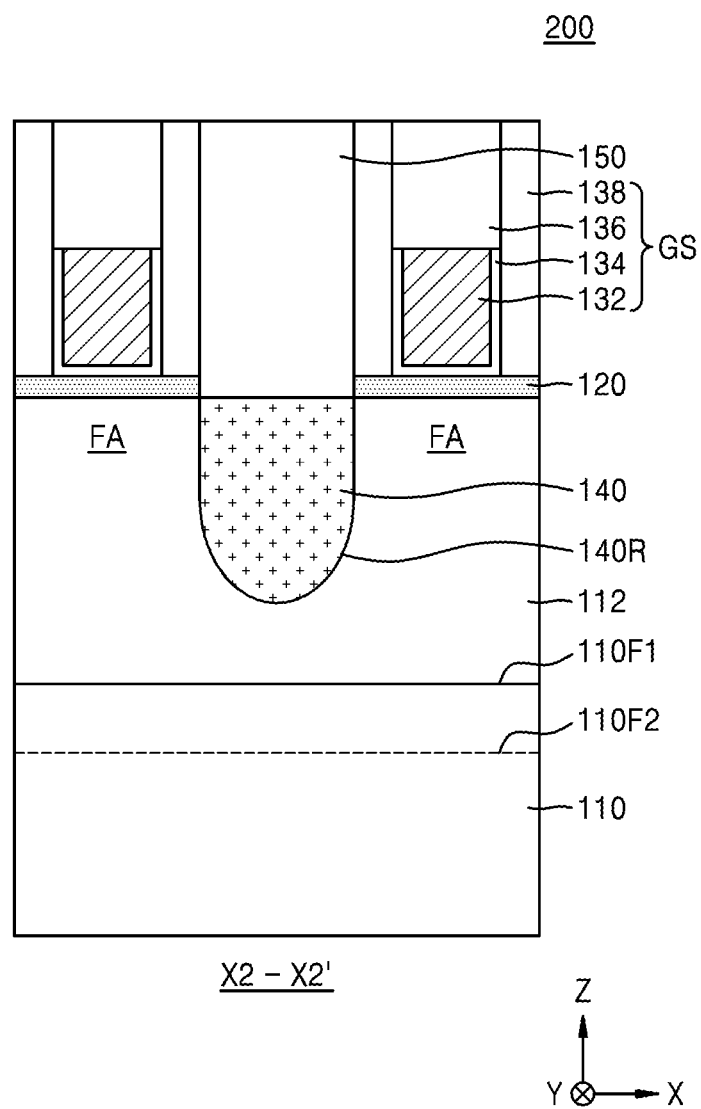
FIG. 10 is a cross-sectional view of the integrated circuit device taken along line X2-X2' in FIG. 9.
Figure 11:
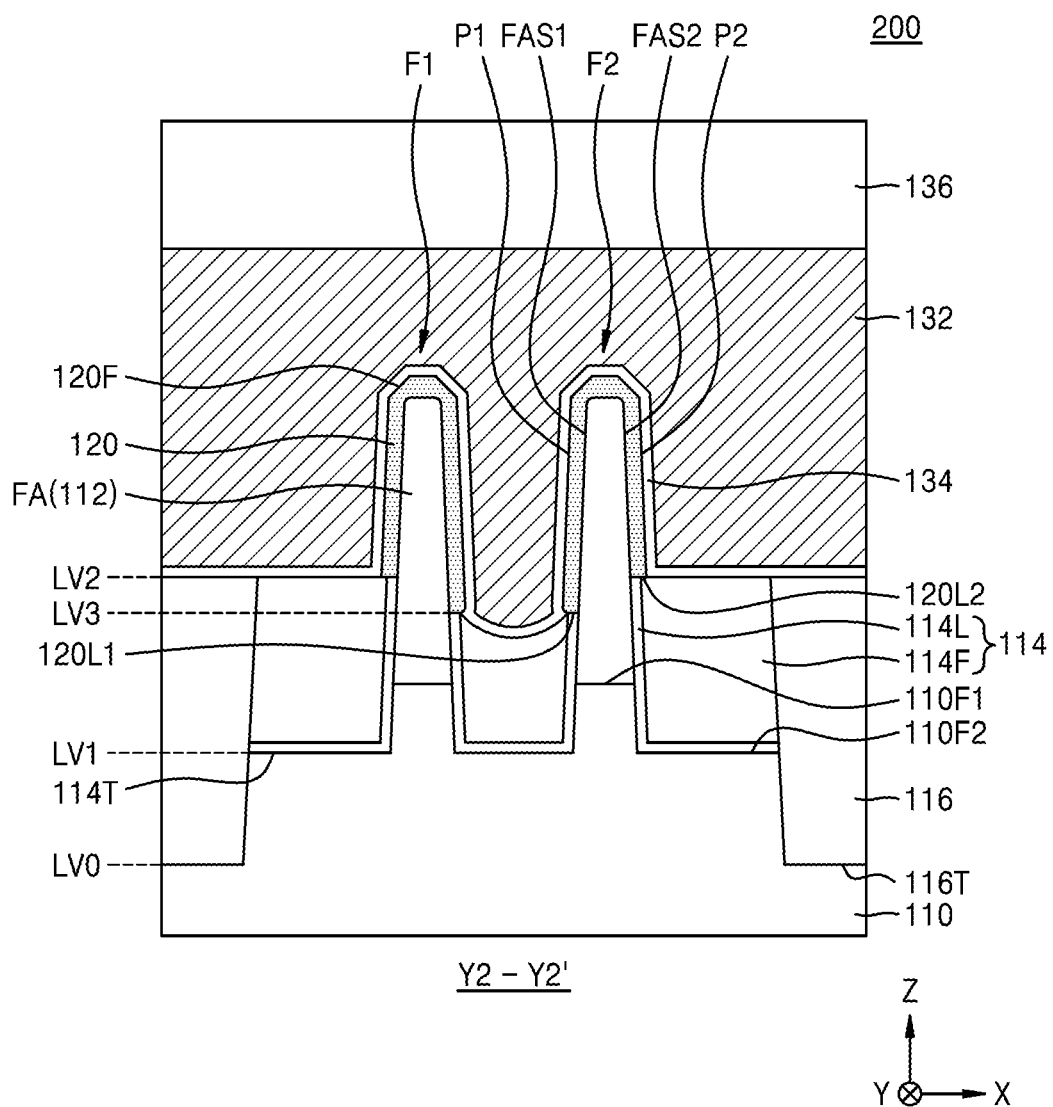
FIG. 11 is a cross-sectional view of the integrated circuit device taken along line Y2-Y2' in FIG. 9.

FIG. 9 is a layout view of an integrated circuit device 200 according to some embodiments. FIG. 10 is a sectional view of the integrated circuit device 200 taken along line X2-X2' in FIG. 9. FIG. 11 is a sectional view of the integrated circuit device 200 taken along line Y2-Y2' in FIG. 9.

Referring to FIGS. 9 through 11, a substrate 110 includes a first active area RX1, a second active area RX2, and deep trench areas DTA. The first active area RX1 and the second active area RX2 may be spaced apart from each other with a deep trench area DTA therebetween.

According to some embodiments, the first active area RX1 may be an active area for a PMOS transistor, and the second active area RX2 may be an active area for an NMOS transistor. According to some embodiments, the first active area RX1 may be an active area for an NMOS transistor having a first threshold voltage, and the second active area RX2 may be an active area for an NMOS transistor having a second threshold voltage that is different from the first threshold voltage.

According to some embodiments, the first active area RX1, the second active area RX2, and the deep trench area DTA may constitute standard cells that perform a logical function. The standard cells may include various types of logic cells including a plurality of circuit devices such as a transistor and a register. The logic cells may constitute, as examples, AND, NAND, OR, NOR, exclusive OR (XOR), exclusive NOR (XNOR), an inverter (INV), an adder (ADD), a buffer (BUF), a delay (DLY), a filter (FIL), a multiplexer (MXT/MXIT), OR/AND/INVERTER (OAI), AND/OR (AO), AND/OR/INVERTER (AOI), a D flip-flop, a reset flip-flop, a master-slave flip-flop, and a latch.

A plurality of fin-type active areas FA may be arranged on the first active area RX1 to protrude from a second upper surface 110F2 of the substrate 110, and each of the plurality of fin-type active areas FA may extend in a first direction (i.e., an X direction). A plurality of fin-type active areas FA may be arranged on the second active area RX2 to protrude from the second upper surface 110F2 of the substrate 110, and each of the plurality of fin-type active areas FA may extend in the first direction (i.e., the X direction). Both sidewalls of the plurality of fin-type active areas FA may be covered by the isolation layer 114. In the deep trench area DTA, a deep trench 116T may be formed to have a certain depth from the second upper surface 110F2 of the substrate 110, and a deep trench isolation layer 116 may fill the inside of the deep trench 116T.

Gate structures GS may each extend in a second direction (i.e., a Y direction) to intersect with the plurality of fin-type active areas FA on the first active area RX1 and the second active area RX2. A detailed description of the gate structures GS may refer to the description given above with reference to FIGS. 1 through 4.

The plurality of fin-type active areas FA intersecting with the first active area RX1 may include a first fin-type active area F1 and a second fin-type active area F2 arranged side by side. The second fin-type active area F2 may include a first sidewall FAS1 facing the first fin-type active area F1, and a second sidewall FAS2 opposite to the first sidewall FAS1.

A capping layer 120 may be arranged on the first fin-type active area F1 and the second fin-type active area F2. The capping layer 120 may have a shape that is asymmetrical about each center of the first fin-type active area F1 and the second fin-type active area F2 in the second direction (i.e., the Y direction). For example, the capping layer 120 on the second fin-type active area F2 may include a first portion P1 arranged on the first sidewall FAS1 of the second fin-type active area F2, and a second portion P2 arranged on the second sidewall FAS2 of the second fin-type active area F2. The second portion P2 of the capping layer 120 may have a bottom surface that is at a higher level than the first portion P1. For example, a bottom surface 120L2 of the second portion P2 may be on a second level LV2 that is the same as the upper surface of the deep trench isolation layer 116, and a bottom surface 120L1 of the first portion P1 may be arranged on a third level LV3 that is lower than the upper surface of the deep trench isolation layer 116. In other words, the upper surface of a portion of the insulation liner 114L that is on the second sidewall FAS2 may be arranged at the second level LV2, and the upper surface of a portion of the insulation liner 114L that is on the first sidewall FAS1 may be arranged at the third level LV3 that is lower than the second level LV2.

The capping layer 120 may be formed on the fin-type active areas FA of both the first active area RX1 and the second active area RX2, or may be formed on the fin-type active areas FA of one of the first active area RX1 and the second active area RX2.

First contacts 172 may be arranged to be connected to the source/drain regions 140, and second contacts 174 may be arranged to be connected to the gate structures GS. The first contacts 172 and the second contacts 174 may include at least one of titanium nitride (TiN), titanium (Ti), tantalum nitride (TaN), tantalum (Ta), ruthenium (Ru), ruthenium nitride (RuN), tungsten (W), cobalt (Co), nickel (Ni), copper (Cu), aluminum (Al), and an alloy thereof.

FIGS. 12A through 20B are cross-sectional views illustrating a method of manufacturing the integrated circuit device 200, according to some embodiments. In detail, 12A, 13A, 16A, 17A, 18A, 19A, and 20A are cross-sectional views corresponding to line X2-X2' of FIG. 9, and FIGS. 12B, 13B, 14, 15, 16B, 17B, 18B, 19B, and 20B are cross-sectional views corresponding to line Y2-Y2' of FIG. 9.

Figure 12A:
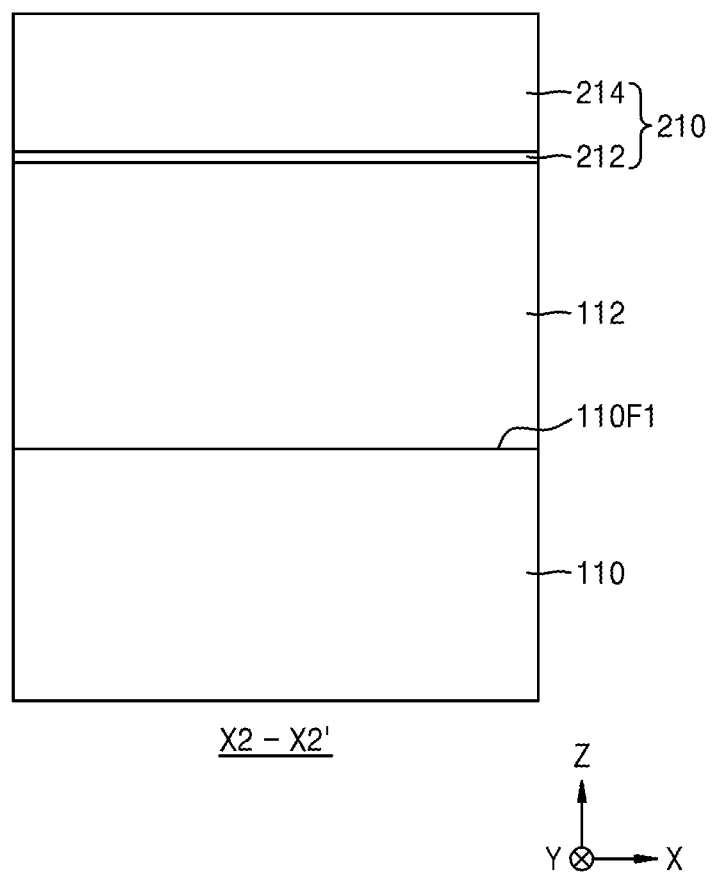
Figure 12B:
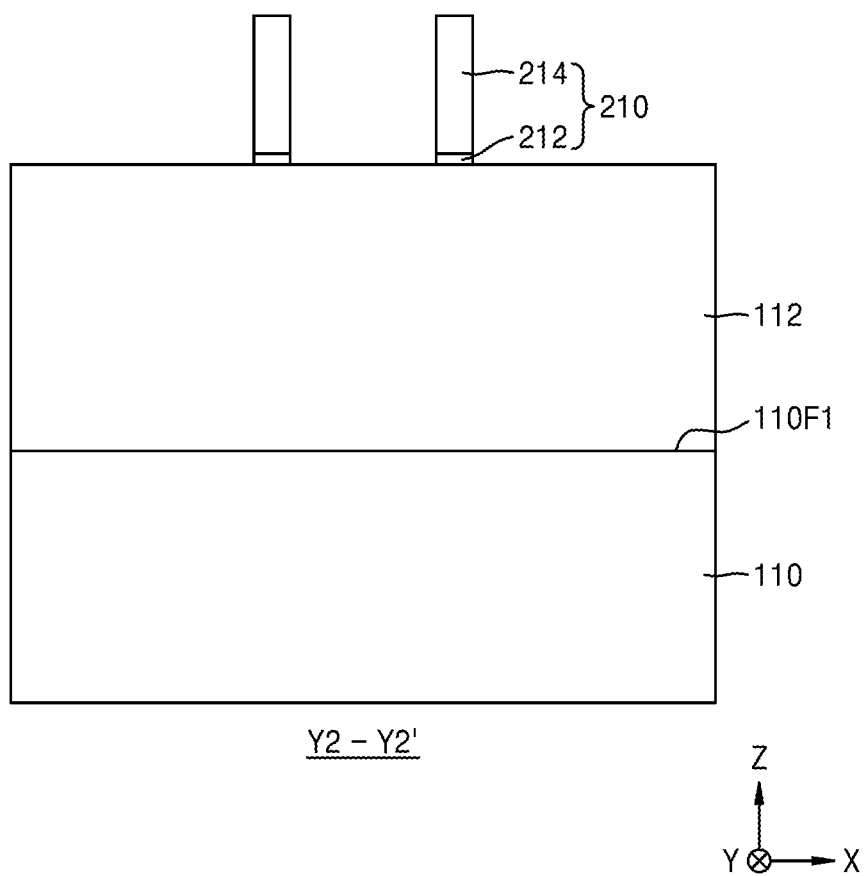

Referring to FIGS. 12A and 12B, the first semiconductor layer 112 may be formed using the first semiconductor material on the first upper surface 110F1 of the substrate 110. The first semiconductor layer 112 may be formed according to an epitaxy process by using the first upper surface 110F1 of the substrate 110 as a seed layer. The epitaxy process may be vapor-phase epitaxy (VPE), a chemical vapor deposition (CVD) process (such as, ultra-high vacuum CVD (UHV-CVD)), molecular beam epitaxy, or a combination thereof. In the epitaxy process, the first semiconductor layer 112 may be formed at a process pressure of about 50 to about 600 torr by using a liquid or gaseous precursor as a precursor necessary for forming the first semiconductor layer 112.

Then, a mask pattern 210 may be formed on the first semiconductor layer 112.

The mask pattern 210 may include a pad oxide layer 212 and a mask material layer 214. For example, the pad oxide layer 212 may include oxide obtained by thermally oxidizing the surface of the first semiconductor layer 112. The mask material layer 214 may include a silicon nitride layer, a silicon oxynitride layer, a spin on glass (SOG) layer, a spin on hardmask (SOH) layer, an amorphous carbon layer, a photoresist layer, or a combination thereof.

Figure 13A:
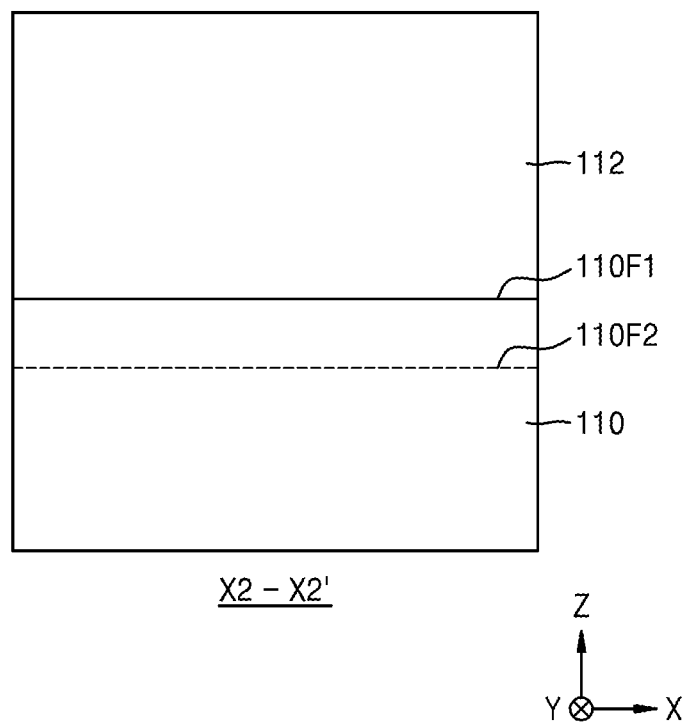
Figure 13B:
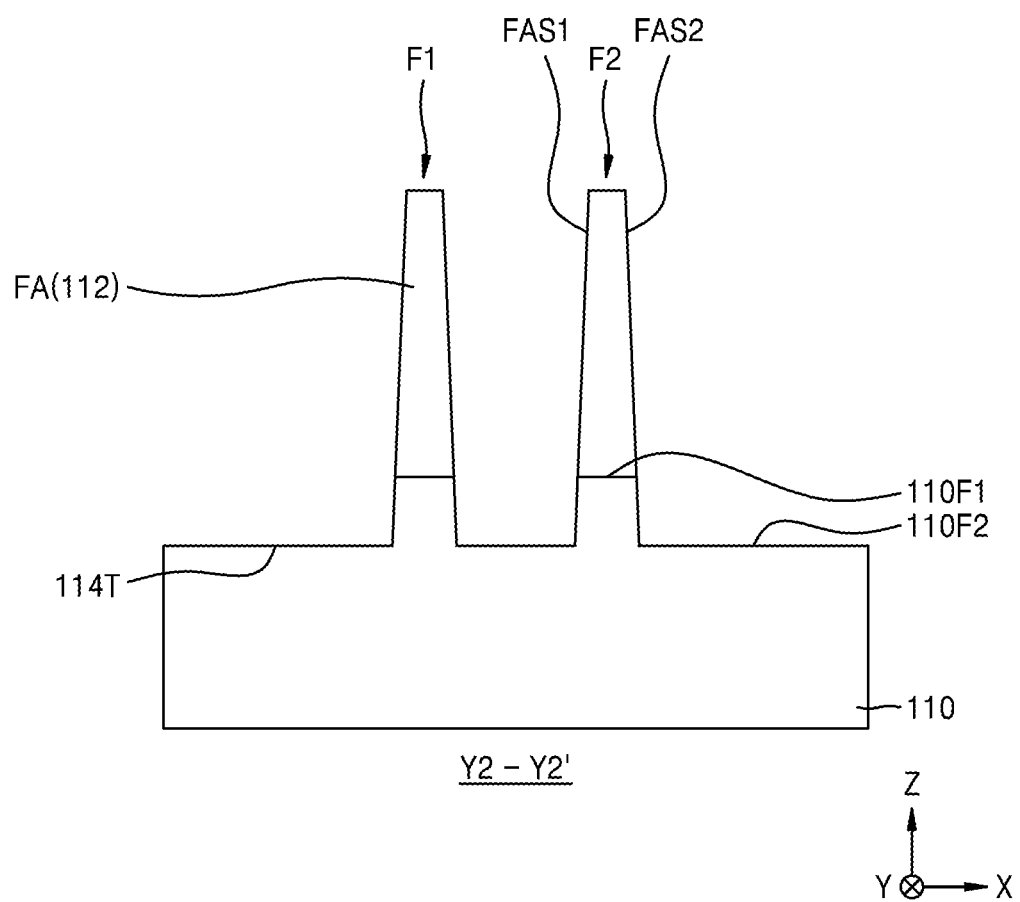

Referring to FIGS. 13A and 13B, the plurality of fin-type active areas FA may be formed by forming an isolation trench 114T by removing the first semiconductor layer 112 and the substrate 110 by a certain thickness by using the mask pattern 210 as an etch mask. The plurality of fin-type active areas FA may protrude from the second upper surface 110F2 of the substrate 110 in a third direction (i.e., a Z direction) and may each extend in the first direction (i.e., the X direction).

Figure 14:
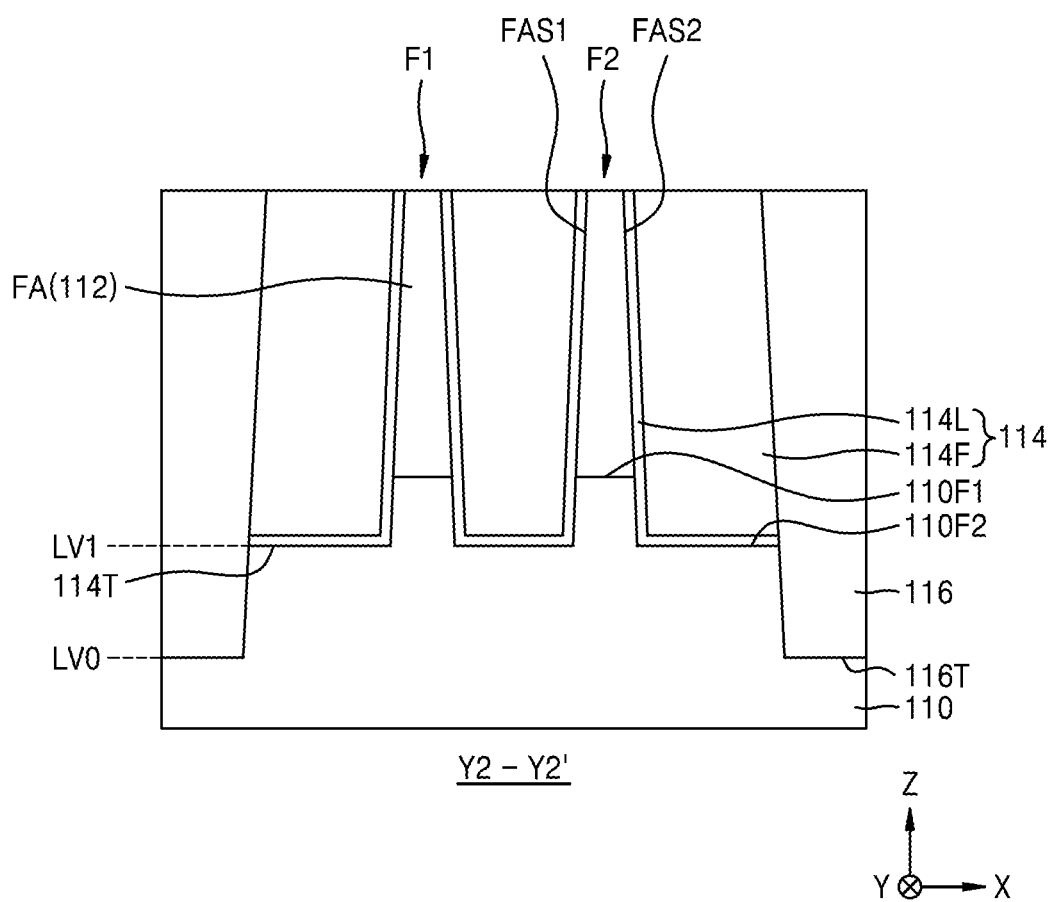

Referring to FIG. 14, the isolation layer 114 including the insulation liner 114L and the insulation filling layer 114F may be formed on the substrate 110.

The isolation layer 114 may be formed by first forming the insulation liner 114L on a sidewall of the isolation trench 114T, then forming the insulation filling layer 114F on the insulation liner 114L to fill a space between the plurality of fin-type active areas FA, and removing respective upper portions of the insulation liner 114L and the insulation filling layer 114F so that the upper surfaces of the plurality of fin-type active areas FA are exposed.

According to some embodiments, the insulation liner 114L may include an oxide layer formed by an oxidization process of oxidizing the surfaces of the plurality of fin-type active areas FA, and the process of oxidizing the surfaces of the plurality of fin-type active areas FA may be, as examples, an in-situ steam generation (ISSG) process, a thermal oxidation process, a UV oxidation process, or an $O_2$ plasma oxidation process. The insulation liner 114L may have a thickness between about 10 Å to about 100 Å, but the inventive concepts are not limited thereto.

According to some embodiments, the insulation filling layer 114F may include an oxide layer formed by flowable chemical vapor deposition (FCVD) process or spin coating process. For example, the insulation filling layer 114F may include, but is not limited to, fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ).

Thereafter, the deep trench 116T may be formed by removing a portion of the isolation layer 114 and a portion of the substrate 110 in the deep trench area DTA, and the deep trench isolation layer 116 may be formed by filling the deep trench 116T with an insulating material. A bottom surface level LV0 of the deep trench isolation layer 116 may be lower than the bottom surface level LV1 of the isolation layer 114.

Figure 15:
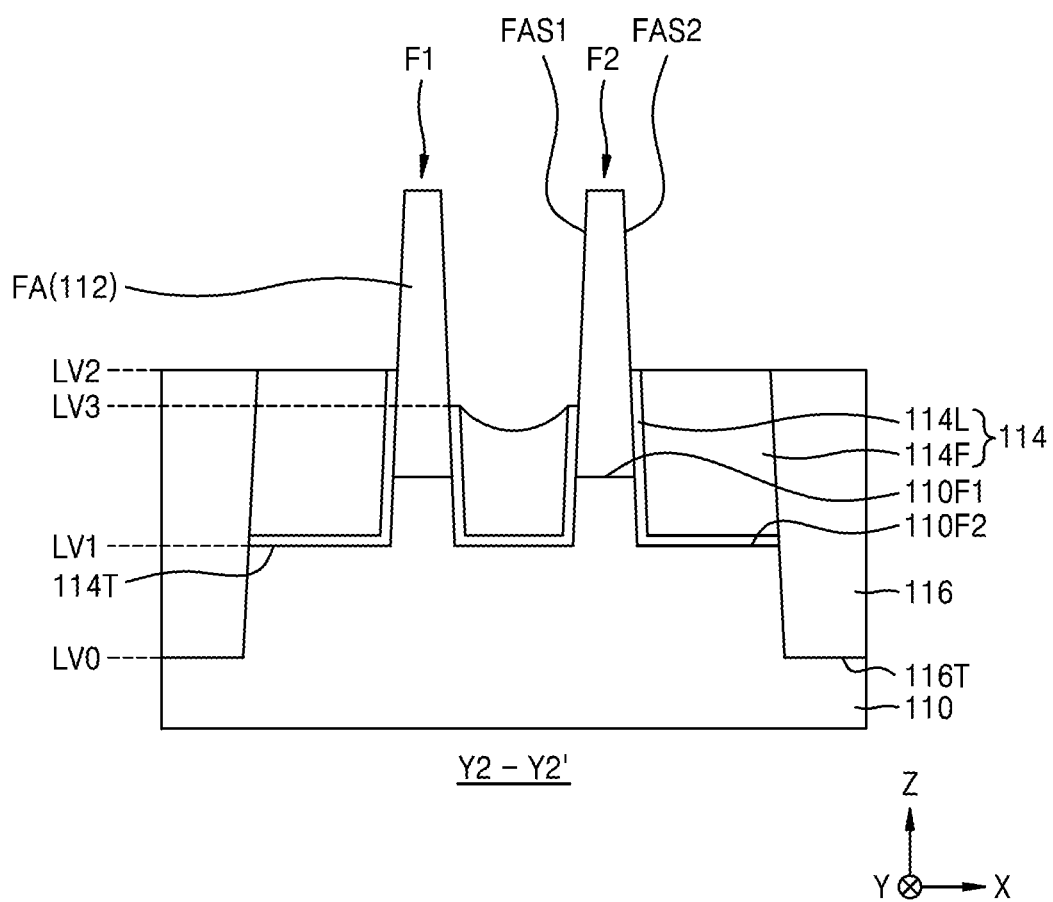

Referring to FIG. 15, respective upper portions of the isolation layer 114 and the deep trench isolation layer 116 may be removed by a certain height via a recess process. Accordingly, the upper surface of the deep trench isolation layer 116 may be on the second level LV2 that is lower than the upper surface of each fin-type active area FA, and the first and second sidewalls FAS1 and FAS2 of each fin-type active area FA may be exposed.

A portion of the isolation layer 114 between the first fin-type active area F1 and the second fin-type active area F2 may be arranged at the third level LV3 that is lower than the second level LV2 (e.g., a level of an upper surface of the deep trench isolation layer 116), whereas a portion of the isolation layer 114 between the first fin-type active area F1 and the deep trench isolation layer 116 and a portion of the isolation layer 114 between the second fin-type active area F2 and the deep trench isolation layer 116 may be arranged at the same level as the second level LV2 (e.g., a level of the upper surface of the deep trench isolation layer 116). Accordingly, a portion of the insulation liner 114L between the first fin-type active area F1 and the second fin-type active area F2 may be arranged at the third level LV3 that is lower than the second level LV2 of the upper surface of the deep trench isolation layer 116, whereas a portion of the insulation liner 114L between the first fin-type active area F1 and the deep trench isolation layer 116 and a portion of the insulation liner 114L between the second fin-type active area F2 and the deep trench isolation layer 116 may be arranged at the same level as the second level LV2 of the upper surface of the deep trench isolation layer 116.

Figure 16A:
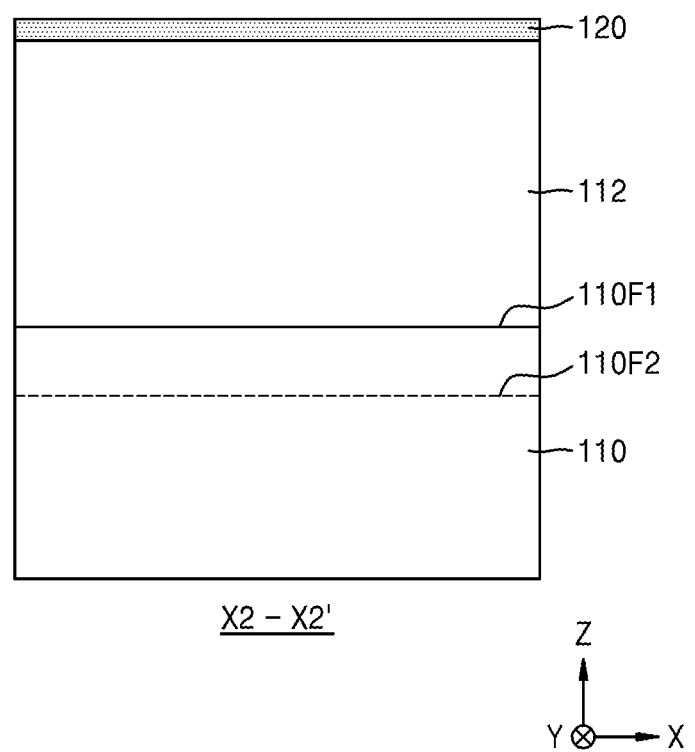
Figure 16B:
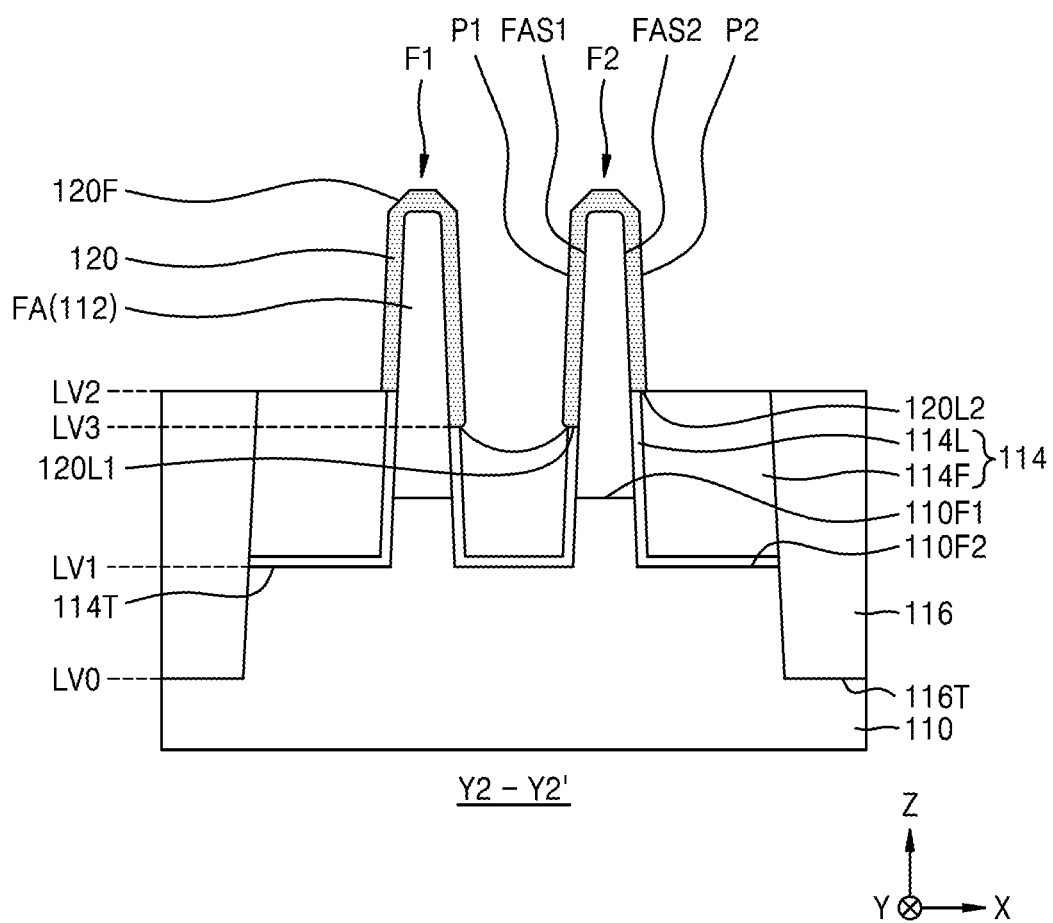

Referring to FIGS. 16A and 16B, the capping layer 120 may be formed on the exposed surfaces of the fin-type active areas FA.

According to some embodiments, the capping layer 120 may be formed using an epitaxy process and a subsequent etchback process. The subsequent etchback process may be performed by using an etchant gas including at least one of germane ($GeH_4$), chlorine ($Cl_2$), and hydrogen chloride (HCl). According to some embodiments, the capping layer 120 may be formed using an epitaxy process, and subsequent first and second etchback processes.

According to some embodiments, the epitaxy process may be performed by a VPE process, a CVD process such as an UHV-CVD process, a molecular beam epitaxy process, or a combination thereof by using, as a source material, at least one of silane, disilane, dichlorosilane, trichlorosilane, and diisoprophyla minosilane (DIPAS). The epitaxy process may be performed at a process temperature of about 300° C. to about 950° C. and a pressure of about 10 to 600 torr.

According to some embodiments, the etchback process may be performed using an etchant gas including at least one of germane ($GeH_4$), chlorine ($Cl_2$), and hydrogen chloride (HCl). The first etchback process may be performed using a first etchant gas including germane ($GeH_4$) and hydrogen chloride (HCl), and the second etchback process may be performed using a second etchant gas including hydrogen chloride (HCl). At least one of the first etchback process and the second etchback process may be performed at a process temperature of about 300° C. to about 950° C. and a pressure of about 10 to 600 torr.

Figure 17A:
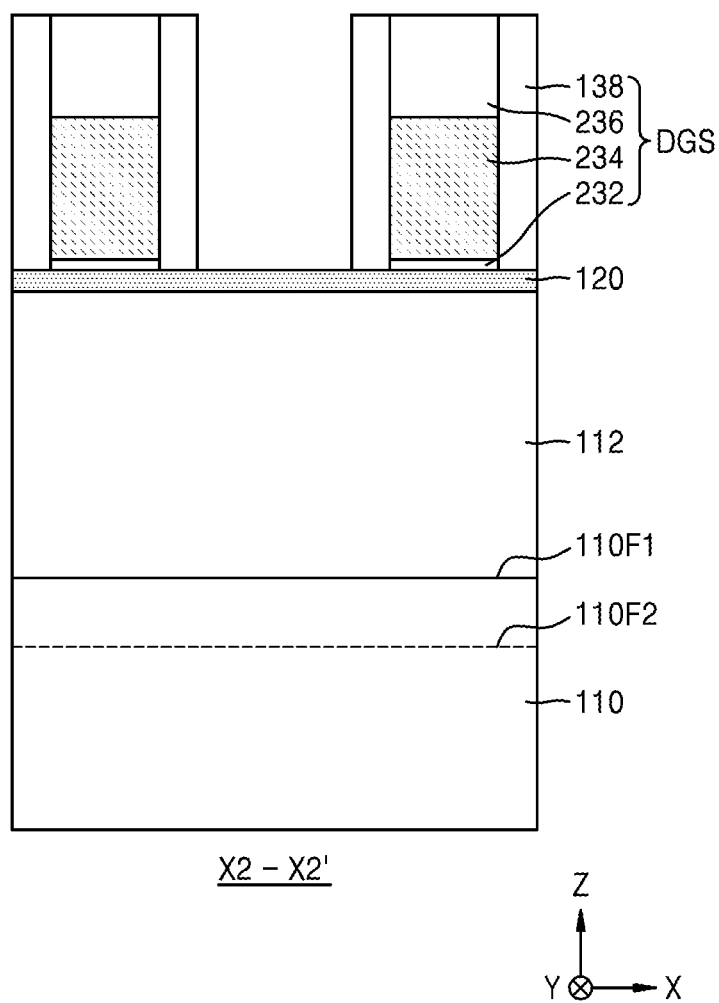
Figure 17B:
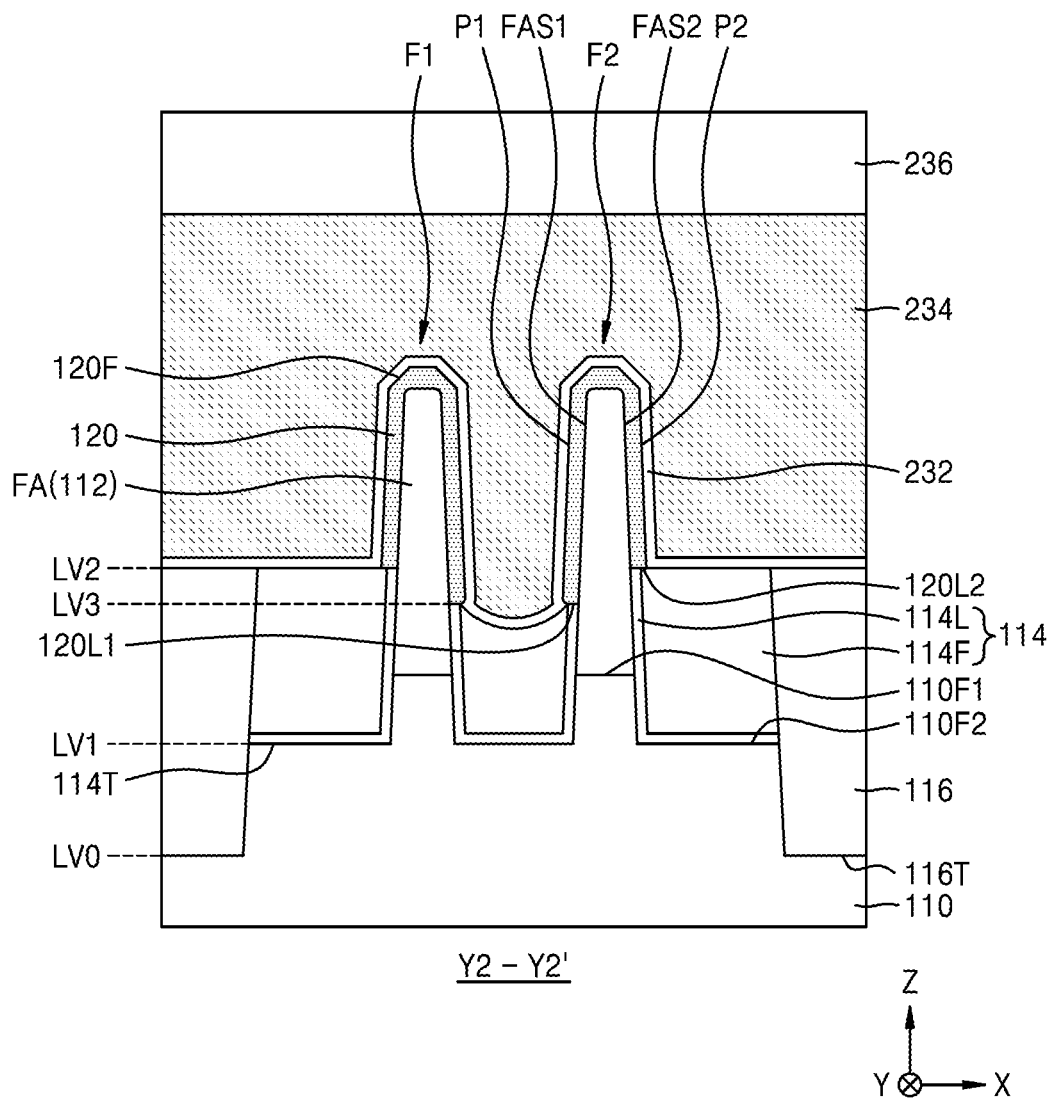

Referring to FIGS. 17A and 17B, a sacrificial gate structure DGS extending in the second direction is formed on the fin-type active areas FA. According to some embodiments, a sacrificial gate insulation layer pattern 232, a sacrificial gate 234, and a hard mask pattern 236 may be sequentially stacked on the substrate 110, then an insulation layer (not shown) covering the hard mask pattern 236, the sacrificial gate 234, and the sacrificial gate insulation layer pattern 232 may be formed using an atomic layer deposition (ALD) process or a CVD process, and then an anisotropical etching process may be performed on the insulation layer, thereby forming a gate spacer 138 on respective sidewalls of the hard mask pattern 236, the sacrificial gate 234, and the sacrificial gate insulation layer pattern 232. The gate spacer 138 may include, but is not limited to, silicon nitride.

Figure 18A:
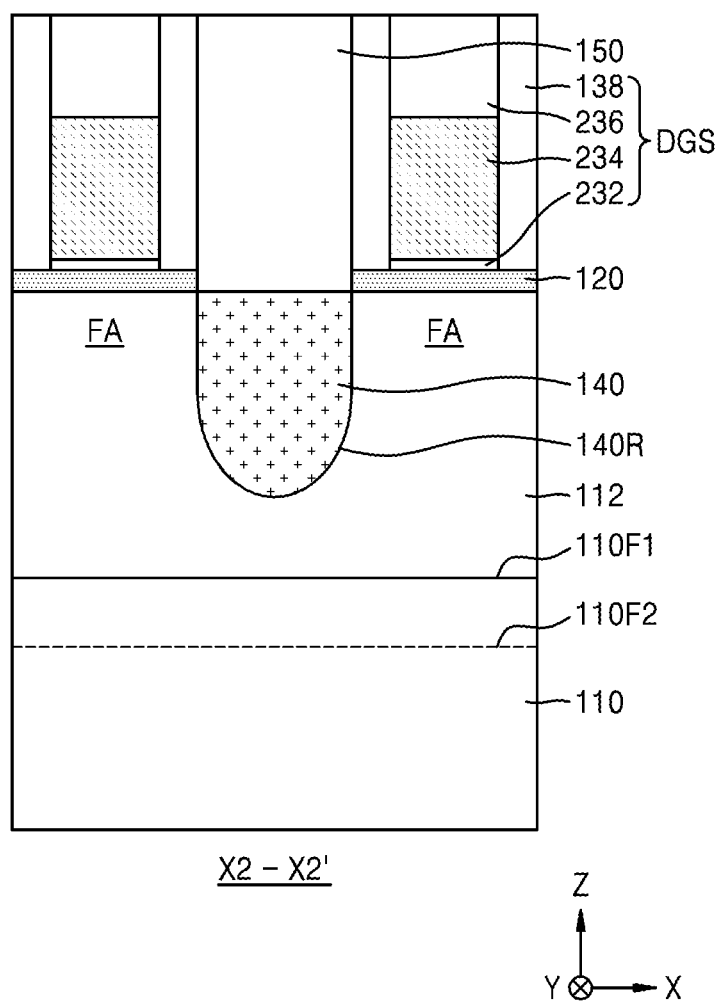
Figure 18B:
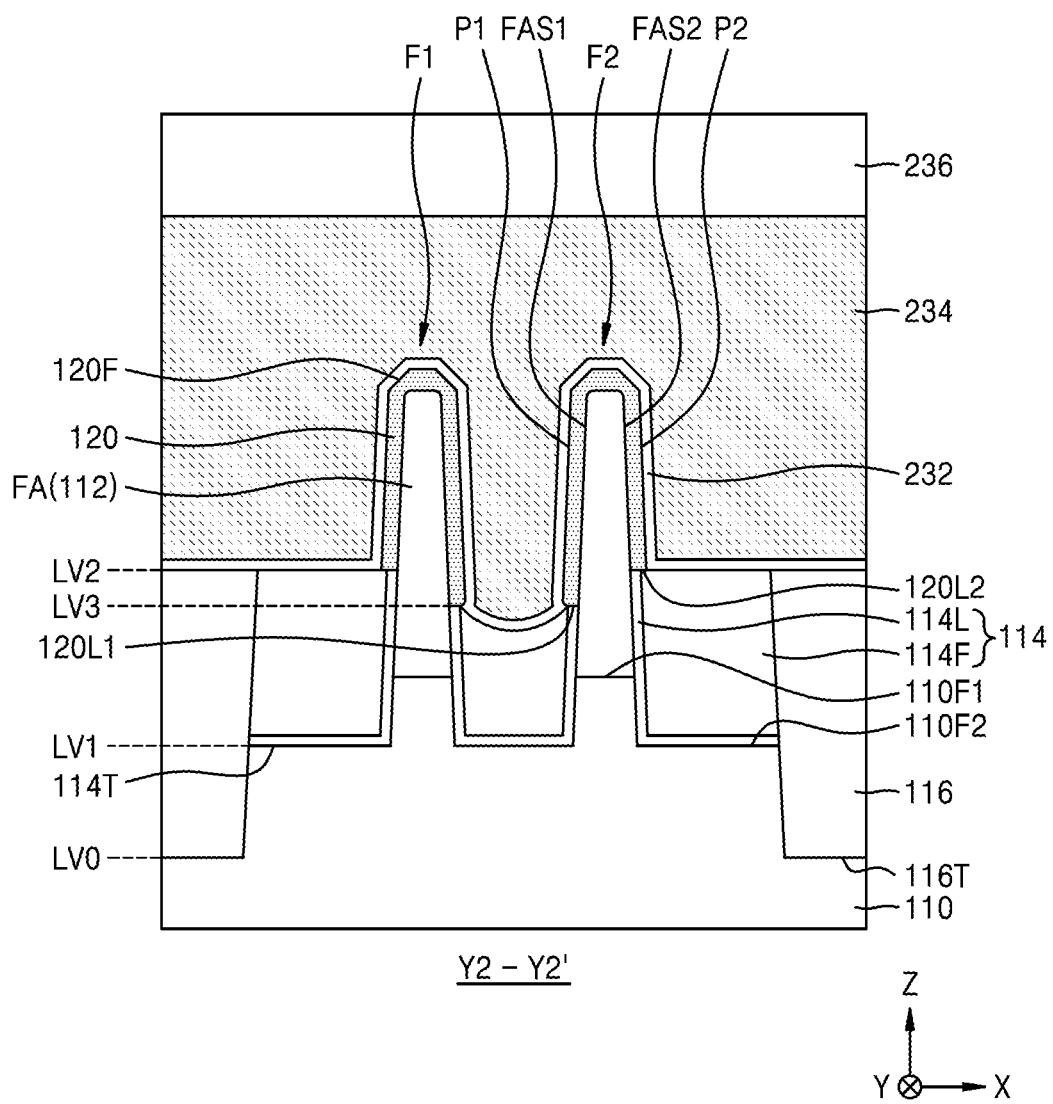

Referring to FIGS. 18A and 18B, recess regions 140R may be formed by etching a portion of the fin-type active areas FA on both sides of the sacrificial gate structure DGS and the gate spacer 138. According to some embodiments, a process of forming the recess regions 140R may include a dry etching process, a wet etching process, or a combination thereof.

Thereafter, the source/drain region 140 may be formed by growing a semiconductor layer (not shown) on the inner wall of each recess region 140R.

The semiconductor layer may be formed according to an epitaxy process by using, as a seed layer, a sidewall of each fin-type active area FA exposed on the inner wall of the recess region 140R. The epitaxy process may be a VPE process, a CVD process such as an UHV-CVD process, a molecular beam epitaxy process, or a combination thereof.

Thereafter, an insulation layer (not shown) covering the sacrificial gate structure DGS and the source/drain region 140 may be formed on the substrate 110, and may be planarized until the upper surface of the hard mask pattern 236 is exposed, thereby forming the inter-gate insulation layer 150.

Figure 19A:
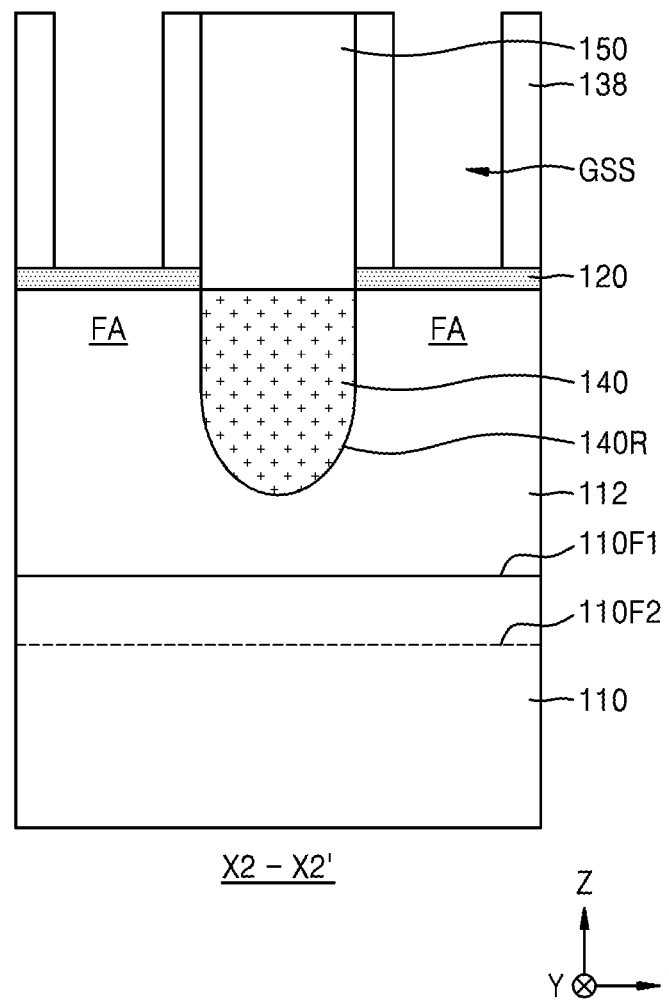
Figure 19B:
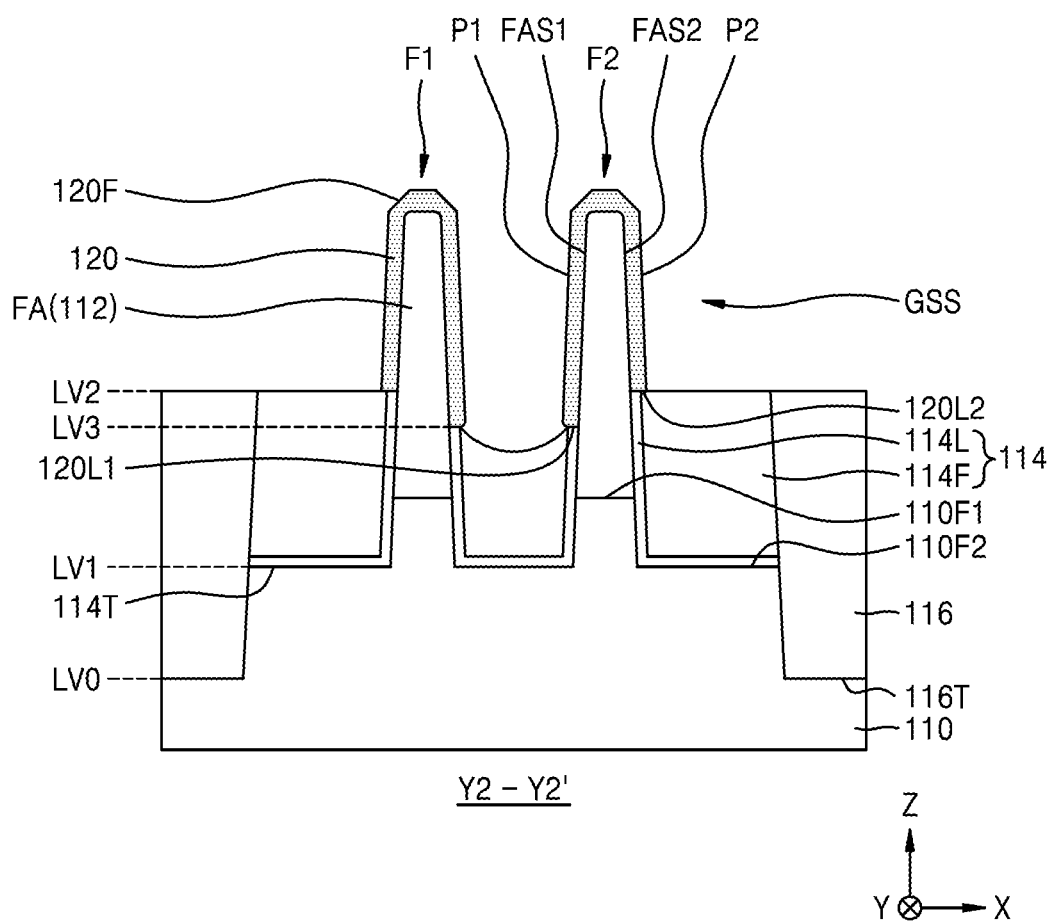

Referring to FIGS. 19A and 19B, a gate space GSS may be formed by removing the hard mask pattern 236 (shown in FIG. 18A), the sacrificial gate 234 (shown in FIG. 18A), and the sacrificial gate insulation layer pattern 232 (shown in FIG. 18A).

According to some embodiment, the gate space GSS may be formed by removing the hard mask pattern 236 (shown in FIG. 18A), the sacrificial gate 234 (shown in FIG. 18A), and the sacrificial gate insulation layer pattern 232 (shown in FIG. 18A) via a wet etching process. The wet etching process may be performed using an etchant including, for example, $HNO_3$, diluted hydrofluoride (DHF), $NH_4OH$, tetramethyl ammonium hydroxide (TMAH), KOH, or a combination thereof. In the removal process, the capping layer 120 may be exposed via the gate space GSS, and the fin-type active area FA may be covered by the capping layer 120 and may be prevented from being oxidized or damaged.

Figure 20A:
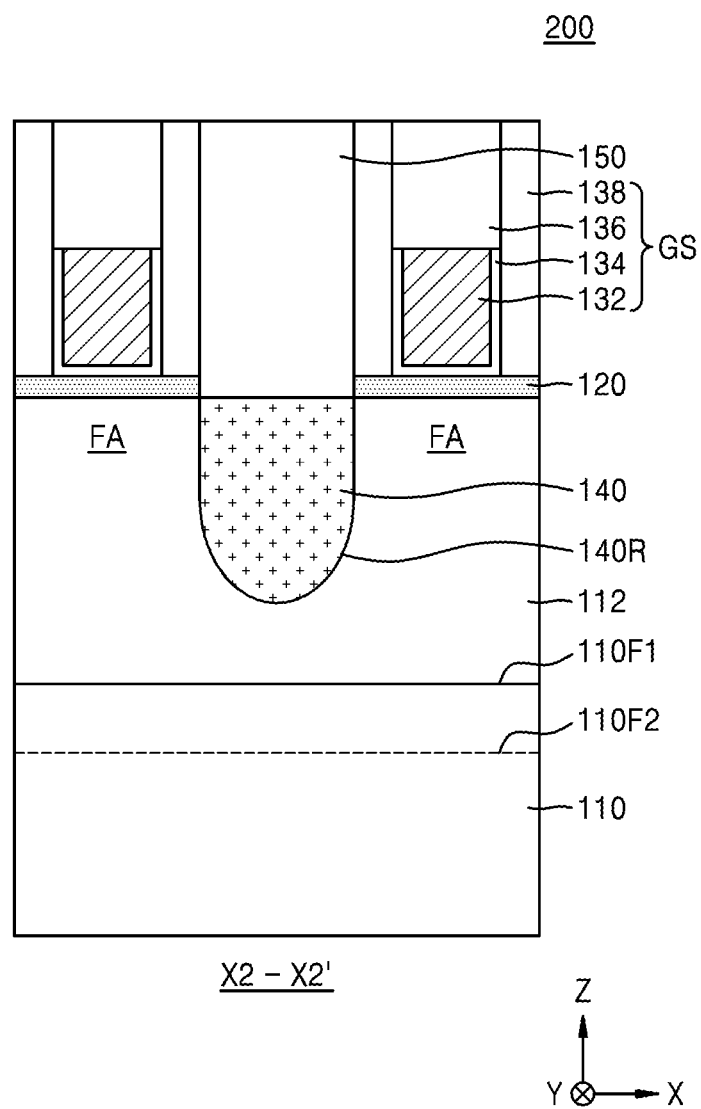
Figure 20B:
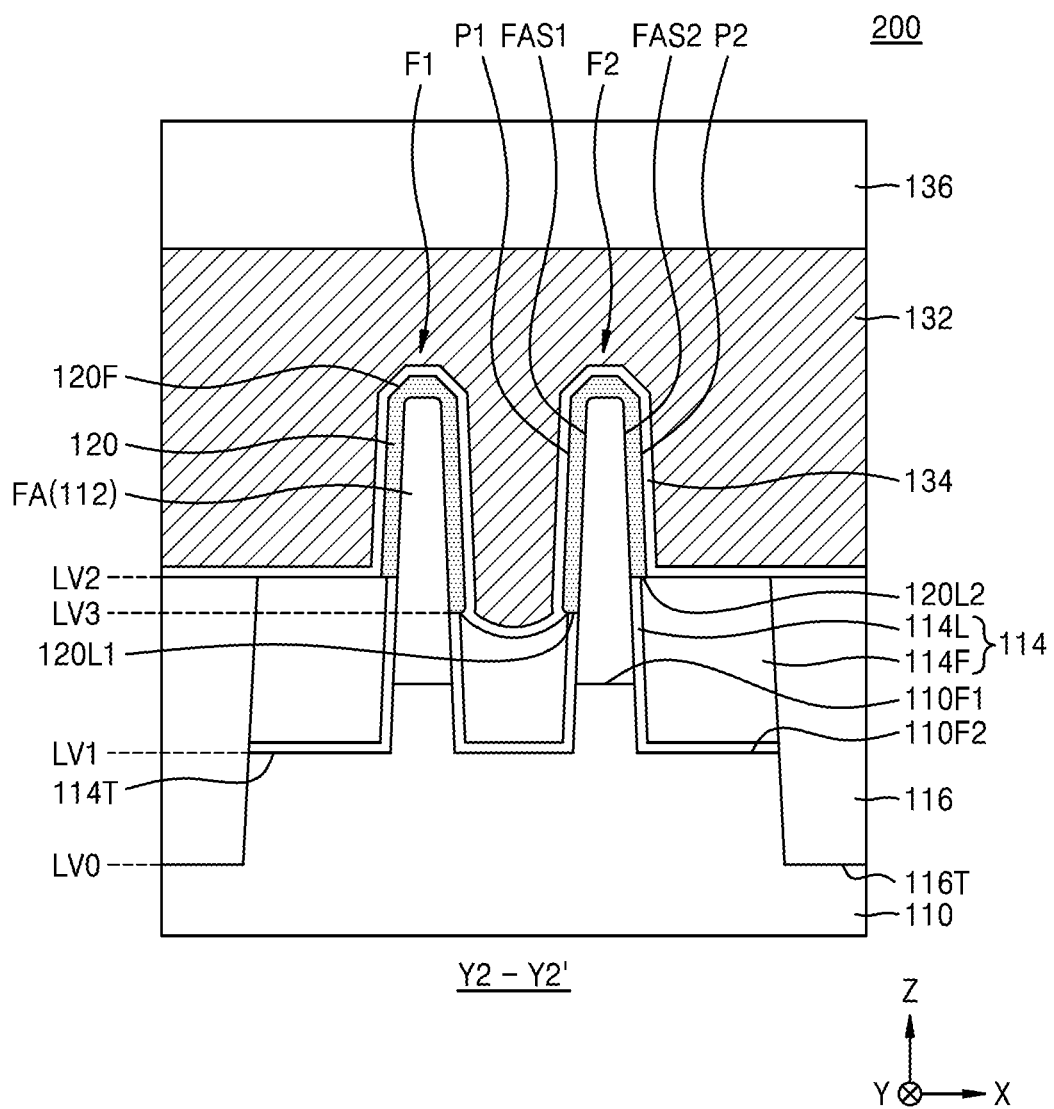

Referring to FIGS. 20A and 20B, the gate insulation layer 134 may be formed on the inner surfaces of a pair of gate spacers 138 and the capping layer 120, namely, on the inner wall of the gate space GSS of FIG. 19A. During the formation of the gate insulation layer 134, the capping layer 120 may be exposed via the gate space GSS, and the fin-type active area FA may be covered by the capping layer 120 and may be prevented from being oxidized or damaged.

Thereafter, a conductive layer (not shown) filling the gate space GSS may be formed on the gate insulation layer 134, and then the gate electrode 132 may be formed by etching back an upper portion of the conductive layer. Then, an insulation layer (not shown) filling a space between the pair of gate spacers 138 may be formed on the gate electrode 132 and the inter-gate insulation layer 150, and then an upper portion of the insulation layer may be removed until the upper surface of the inter-gate insulation layer 150 or the gate spacers 138 is exposed, thereby forming the gate capping layer 136. Accordingly, the gate structure GS including the gate electrode 132, the gate insulation layer 134, the gate capping layer 136, and the gate spacers 138 may be formed.

Then, an interlayer insulation layer (not shown) may be formed on the gate structure GS and the inter-gate insulation layer 150. Although not shown in the drawings, contact holes (not shown) exposing the upper surface of the source/drain region 140 and the upper surface of the gate electrode 132 may be formed by penetrating the interlayer insulation layer, and a first contact 172 and a second contact 174 respectively connected to the source/drain region 140 and the gate electrode 132 may be formed by filling the contact holes with a conductive material.

In this way, the integrated circuit device 200 is completed. According to the above-described manufacturing method, the capping layer 120 may be formed on the surfaces of the fin-type active areas FA via the epitaxy process and the subsequent etchback process. Because the capping layer 120 may prevent the surfaces of the fin-type active areas FA from being oxidized or damaged in a process of removing a sacrificial gate structure or in a process of forming the gate insulation layer 134, an increase in the interface defect density of the gate insulation layer 134 or occurrence of the TDDB may be prevented, and the integrated circuit device 200 may have a high reliability.

Additionally or alternatively, after the capping layer 120 is formed, a plasma nitrification process may be further performed on respective exposed surfaces of the capping layer 120 and the isolation layer 114. The plasma nitrification process may be performed using, for example, $N_2$, $NH_3$, $N_2H_2$, or $N_2H_4$. Due to the plasma nitrification process, a portion of the capping layer 120 around the surface thereof and a portion of the isolation layer 114 around the surface thereof may be transformed into silicon nitride, and thus the interface layer 160 may be further formed. In this way, the integrated circuit device 100C of FIG. 7 may be manufactured. Because the interface layer 160 has a relatively strong silicon-nitrogen bond, the surfaces of the fin-type active areas FA may be prevented from being oxidized or damaged in a subsequent process of removing the sacrificial gate structure DGS or in a subsequent process of forming the gate insulation layer 134.

Additionally or alternatively, after the capping layer 120 is formed, a hydrogen plasma annealing process may be further performed on the respective exposed surfaces of the capping layer 120 and the isolation layer 114. Due to the hydrogen plasma annealing process, silicon atoms may locally migrate around the surfaces of the fin-type active areas FA, and thus, the facet surface of the capping layer 120D may be changed to the curved surface 120FC. In this way, the integrated circuit device 100D of FIG. 8 may be manufactured.

While the inventive concepts have been particularly shown and described with reference to examples of embodiments thereof, it will be understood that various changes in form and details may be made therein without departing from the spirit of the following claims.

What is claimed is:

1. An integrated circuit device comprising:
a fin-type active area protruding from a substrate, extending in a first direction parallel to an upper surface of the substrate, and including a first semiconductor material;
an isolation layer arranged on the substrate and covering a lower portion of a sidewall of the fin-type active area, the isolation layer including an insulation liner arranged on the lower portion of the sidewall of the fin-type active area, and an insulation filling layer on the insulation liner;
a capping layer surrounding an upper surface and an upper portion of the sidewall of the fin-type active area, including a second semiconductor material that is different from the first semiconductor material, wherein the capping layer comprises an upper surface, a sidewall, and a facet surface between the upper surface and the sidewall, the facet surface inclined at a first angle with respect to the upper surface of the substrate, and the first angle is between about 30° to about 60°; and
a gate structure arranged on the capping layer and extending in a second direction that is parallel to the upper surface of the substrate and perpendicular to the first direction,
wherein the capping layer has a first thickness on the upper surface of the fin-type active area, wherein the capping layer has a second thickness along the sidewall of the fin-type active area, and wherein the second thickness is less than the first thickness, and
wherein a connection portion between the upper surface of the fin-type active area and the sidewall of the fin-type active area is rounded, and a profile of the connection portion is different from a profile of the faceted surface.

2. The integrated circuit device of claim 1, wherein an upper surface of the insulation liner contacts a bottom surface of the capping layer, and
wherein the bottom surface of the capping layer is equidistant from the upper surface of the substrate as an upper surface of the isolation layer.

3. The integrated circuit device of claim 1, wherein the fin-type active area includes silicon germanium, and wherein the capping layer includes silicon.

4. The integrated circuit device of claim 1, wherein the fin-type active area includes a surface area having a distance that is less than a first distance from the sidewall of the fin-type active area, and an inside area having a distance that is greater than the first distance from the sidewall of the fin-type active area, and
wherein the surface area has a first germanium content and the inside area has a second germanium content that is less than the first germanium content.

5. The integrated circuit device of claim 4,
wherein the surface area of the fin-type active area has a first bandgap energy,
wherein the inside area of the fin-type active area has a second bandgap energy,
wherein the capping layer has a third bandgap energy, and
wherein the third bandgap energy is greater than the second bandgap energy and the second bandgap energy is greater than the first bandgap energy.

6. The integrated circuit device of claim 1, further comprising:
an interface layer arranged between the capping layer and the gate structure, and
the interface layer includes the second semiconductor material including nitrogen at a first concentration.

7. An integrated circuit device comprising:
a fin-type active area protruding from a substrate, extending in a first direction parallel to an upper surface of the substrate, and including silicon germanium;
an isolation layer arranged on the substrate and covering a lower portion of a sidewall of the fin-type active area, the isolation layer including an insulation liner arranged on the lower portion of the sidewall of the fin-type active area, and an insulation filling layer on the insulation liner;
a capping layer surrounding an upper surface and the sidewall of the fin-type active area, the capping layer including silicon, and the capping layer comprising an upper surface, a sidewall, and a facet surface between the upper surface and the sidewall; and
a gate structure arranged on the capping layer and extending in a second direction that is parallel to the upper surface of the substrate and perpendicular to the first direction,
wherein, on the sidewall of the fin-type active area, a bottom surface of the capping layer contacts an upper surface of the insulation liner,
wherein the fin-type active area includes a surface area having a distance that is less than a first distance from the sidewall of the fin-type active area, and an inside area having a distance that is greater than the first distance from the sidewall of the fin-type active area, and
wherein the surface area has a first germanium content and the inside area has a second germanium content that is less than the first germanium content.

8. The integrated circuit device of claim 7, wherein an upper portion of the sidewall of the fin-type active area contacts the capping layer, and
the lower portion of the sidewall of the fin-type active area contacts the insulation liner.

9. The integrated circuit device of claim 7, wherein the facet surface is inclined at a first angle between about 30° to about 60° with respect to the upper surface of the substrate,
wherein the capping layer has a first thickness on the upper surface of the fin-type active area, and
wherein the capping layer has a second thickness at an edge of the facet surface, the second thickness being less than the first thickness.

10. An integrated circuit device comprising:
a fin-type active area protruding from a substrate, extending in a first direction parallel to an upper surface of the substrate, and including a first semiconductor material;
an isolation layer arranged on the substrate and covering a lower portion of a sidewall of the fin-type active area;
a capping layer surrounding an upper surface and the sidewall of the fin-type active area, the capping layer including a second semiconductor material that is different from the first semiconductor material, wherein the capping layer comprises an upper surface, a sidewall, and a facet surface between the upper surface and the sidewall, wherein the capping layer has a first thickness on the upper surface of the fin-type active area, wherein the capping layer has a second thickness along a side surface of the fin-type active area, and wherein the second thickness is less than the first thickness; and
a gate structure arranged on the capping layer and extending in a second direction that is parallel to the upper surface of the substrate and perpendicular to the first direction.

11. The integrated circuit device of claim 10, wherein the isolation layer includes an insulation liner arranged on the lower portion of the sidewall of the fin-type active area, and an insulation filling layer on the insulation liner.

12. The integrated circuit device of claim 10, wherein the facet surface is inclined at a first angle with respect to the upper surface of the substrate, and the first angle is between about 30° to about 60°.

13. The integrated circuit device of claim 10, wherein an upper surface of the isolation layer contacts a bottom surface of the capping layer, and wherein the bottom surface of the capping layer is as far from the upper surface of the substrate as an upper surface of the isolation layer is from the upper surface of the substrate.

14. The integrated circuit device of claim 10, wherein the fin-type active area includes silicon germanium, and wherein the capping layer includes silicon.

15. The integrated circuit device of claim 10, wherein the fin-type active area includes a surface area having a distance that is less than a first distance from the sidewall of the fin-type active area, and an inside area having a distance that is greater than the first distance from the sidewall of the fin-type active area, and
wherein the surface area has a first germanium content and the inside area has a second germanium content that is less than the first germanium content.

16. The integrated circuit device of claim 15, wherein the surface area of the fin-type active area has a first bandgap energy, wherein the inside area of the fin-type active area has a second bandgap energy, wherein the capping layer has a third bandgap energy, and wherein the third bandgap energy is greater than the second bandgap energy and the second bandgap energy is greater than the first bandgap energy.

* * * * *